(12) United States Patent
Song et al.

(10) Patent No.: US 11,837,545 B2
(45) Date of Patent: Dec. 5, 2023

(54) SEMICONDUCTOR MEMORY DEVICE

(71) Applicant: Samsung Electronics Co., Ltd., Suwon-si (KR)

(72) Inventors: Jungwoo Song, Hwaseong-si (KR); Ye-Ro Lee, Seoul (KR); Kwangtae Hwang, Seoul (KR); Kwangmin Kim, Hwaseong-si (KR); Yong Kwan Kim, Yongin-si (KR); Jiyoung Kim, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 98 days.

(21) Appl. No.: 17/399,043

(22) Filed: Aug. 10, 2021

(65) Prior Publication Data

US 2021/0375764 A1 Dec. 2, 2021

Related U.S. Application Data

(60) Division of application No. 16/561,008, filed on Sep. 4, 2019, now abandoned, which is a continuation of
(Continued)

(30) Foreign Application Priority Data

Dec. 19, 2016 (KR) .......................... 10-2016-0173827

(51) Int. Cl.
*H10B 12/00* (2023.01)
*H01L 23/532* (2006.01)
(Continued)

(52) U.S. Cl.
CPC ........ *H01L 23/5329* (2013.01); *H01L 21/768* (2013.01); *H01L 27/0207* (2013.01);
(Continued)

(58) Field of Classification Search
CPC ... H10B 12/0335; H10B 12/315; H10B 12/34
See application file for complete search history.

(56) References Cited

U.S. PATENT DOCUMENTS 8,697,525 B2 4/2014 Kim et al.
8,999,797 B2 4/2015 Joung et al.
(Continued)

FOREIGN PATENT DOCUMENTS

KR 20140083737 A 7/2014
KR 20150045782 A 4/2015

*Primary Examiner* — Nelson Garces
(74) *Attorney, Agent, or Firm* — Renaissance IP Law Group LLP

(57) ABSTRACT

A semiconductor device including a substrate includes an active region. A bit line structure extends across the active region. A landing pad is disposed on an end portion of the active region. A first spacer is disposed between the bit line structure and the landing pad. A second spacer is disposed between the first spacer and the landing pad. An air spacer is disposed between the first spacer and the second spacer. A capping pattern is disposed between a sidewall of the landing pad and a sidewall of the bit line structure. The capping pattern defines a top surface of the air spacer and comprises a metallic material.

20 Claims, 22 Drawing Sheets

Related U.S. Application Data application No. 15/706,655, filed on Sep. 15, 2017, now Pat. No. 10,453,796.

(51) Int. Cl.
    *H01L 27/02*     (2006.01)
    *H01L 21/768*     (2006.01)
    *H01L 23/522*     (2006.01)

(52) U.S. Cl.
    CPC ......... *H10B 12/033* (2023.02); *H10B 12/053* (2023.02); *H10B 12/315* (2023.02); *H10B 12/34* (2023.02); *H10B 12/482* (2023.02); *H10B 12/485* (2023.02); *H01L 21/7682* (2013.01); *H01L 21/76897* (2013.01); *H01L 23/5222* (2013.01)

(56) References Cited

U.S. PATENT DOCUMENTS

| | | |
|---|---|---|
| 9,293,362 B2 | 3/2016 | Lee et al. |
| 9,337,202 B2 | 5/2016 | Lim et al. |
| 9,515,022 B2 | 12/2016 | Kwon et al. |
| 2005/0046048 A1 | 3/2005 | Yun et al. |
| 2006/0264056 A1 | 11/2006 | Manning |
| 2010/0285662 A1 | 11/2010 | Kim et al. |
| 2012/0168899 A1 | 7/2012 | Kim et al. |
| 2013/0292847 A1 | 11/2013 | Choi et al. |
| 2013/0328199 A1 | 12/2013 | Yun et al. |
| 2014/0175659 A1 | 6/2014 | Lee et al. |
| 2014/0357076 A1 | 12/2014 | Joung et al. |
| 2015/0214143 A1 | 7/2015 | Tsai et al. |
| 2016/0005743 A1 | 1/2016 | Lim et al. |
| 2016/0211215 A1* | 7/2016 | Lee .................. H01L 23/5222 |
| 2016/0276273 A1 | 9/2016 | Kwon et al. |

\* cited by examiner

SEMICONDUCTOR MEMORY DEVICE

CROSS-REFERENCE TO RELATED APPLICATION

This application is a divisional of U.S. patent application Ser. No. 16/561,008, filed on Sep. 4, 2019, which is a continuation of U.S. patent application Ser. No. 15/706,655, filed on Sep. 15, 2017, which claims priority under 35 U.S.C § 119 of Korean Patent Application No. 10-2016-0173827, filed on Dec. 19, 2016 in the Korean Intellectual Property Office, the disclosure of which is incorporated by reference herein in its entirety.

TECHNICAL FIELD

The present inventive concept relates to a semiconductor memory device.

DISCUSSION OF RELATED ART

Semiconductor devices are highly integrated. Line widths of the semiconductor devices are reduced using new exposure techniques and/or expensive exposure techniques for high integration of the semiconductor devices.

SUMMARY

According to an exemplary embodiment of the present inventive concept, a semiconductor memory device is provided as follows. A substrate includes an active region. A bit line structure extends across the active region. A landing pad is disposed on an end portion of the active region. A first spacer is disposed between the bit line structure and the landing pad. A second spacer is disposed between the first spacer and the landing pad. An air spacer is disposed between the first spacer and the second spacer. A capping pattern is disposed between a sidewall of the landing pad and a sidewall of the bit line structure. The capping pattern defines a top surface of the air spacer and comprises a metallic material.

According to an exemplary embodiment of the present inventive concept, a semiconductor memory device is provided as follows. A substrate includes an active region. A bit line structure extends across the active region. A landing pad is disposed on an end portion of the active region. A first spacer is disposed between the bit line structure and the landing pad. A second spacer is disposed between the first spacer and the landing pad. An air spacer is disposed between the first spacer and the second spacer. A capping pattern is disposed between a sidewall of the landing pad and a sidewall of the bit line structure. The capping pattern defines a top surface of the air spacer and comprises substantially the same material as the landing pad.

According to an exemplary embodiment of the present inventive concept, a semiconductor memory device is provided as follows. A substrate has a first active region and a second active region. A stacked structure of a storage node contact, a landing pad and a data storage member stacked vertically on each other is disposed on the first active region of the substrate. A bit line adjacent to the stacked structure is disposed on the second active region. A capping pattern protrudes away from a sidewall of the landing pad in the stacked structure. An air gap is disposed between a sidewall of the stacked structure and a sidewall of the bit line. An upper surface of the air gap is in contact with the capping pattern.

BRIEF DESCRIPTION OF DRAWINGS

These and other features of the present inventive concept will become more apparent by describing in detail exemplary embodiments thereof with reference to the accompanying drawings of which:

FIGS. 4A to 11A are layout views illustrating a method of fabricating a semiconductor memory device according to an exemplary embodiment of the present inventive concept; and FIGS. 4B to 11B and 11C are cross-sectional views taken along lines I-I' and II-II' of FIGS. 4A to 11A illustrating a method of fabricating a semiconductor memory device according to an exemplary embodiment of the present inventive concept.

Figure 1:
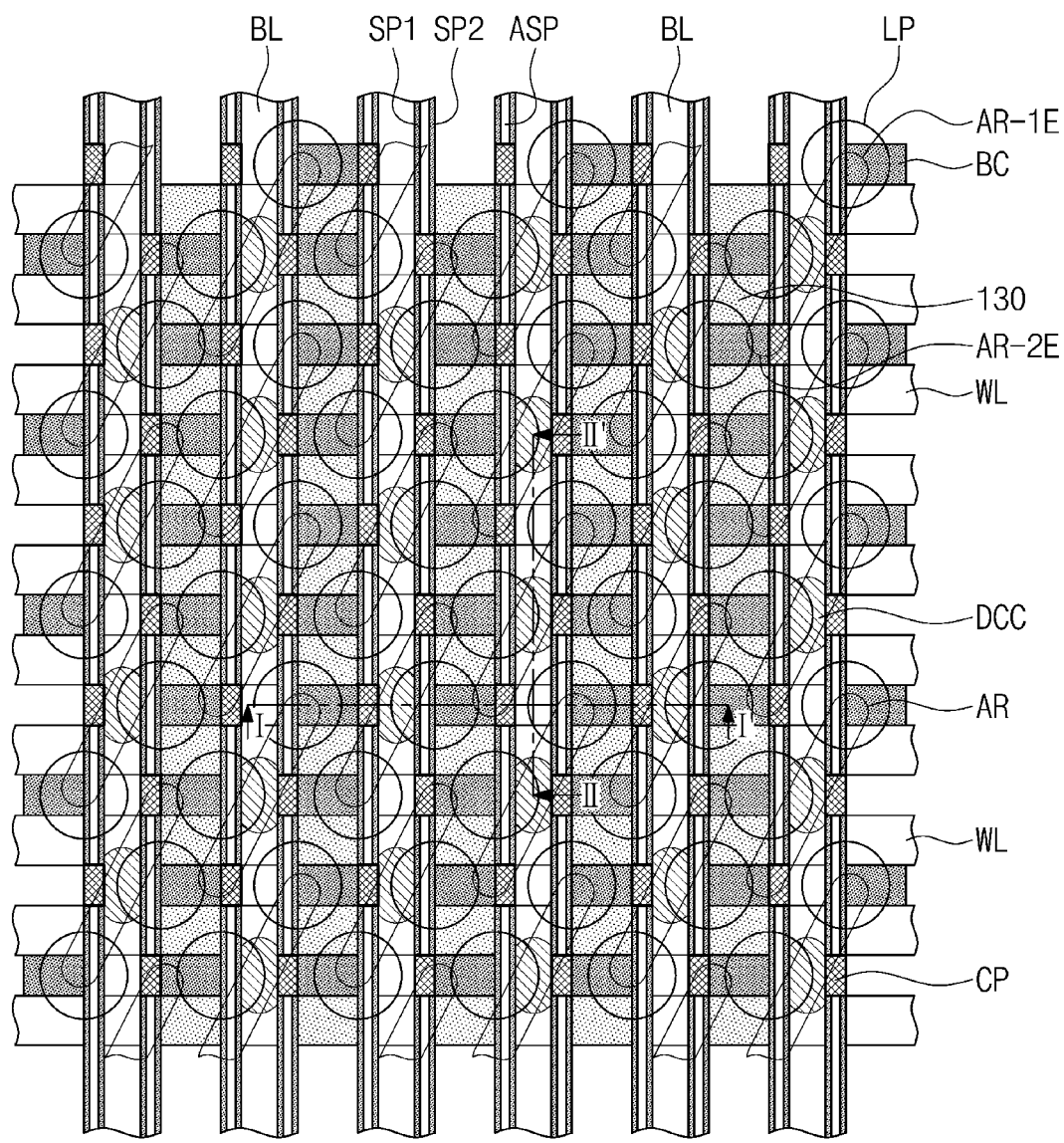
FIG. 1 is a layout view illustrating a semiconductor memory device according to an exemplary embodiment of the present inventive concept.

Although corresponding layout views and/or perspective views of some cross-sectional view(s) may not be shown, the cross-sectional view(s) of device structures illustrated herein provide support for a plurality of device structures that extend along two different directions as would be illustrated in a layout view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a layout view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

As used herein, singular "a," "an," and "the" are intended to cover the plural forms as well, unless the context clearly indicates otherwise.

Figure 2A:
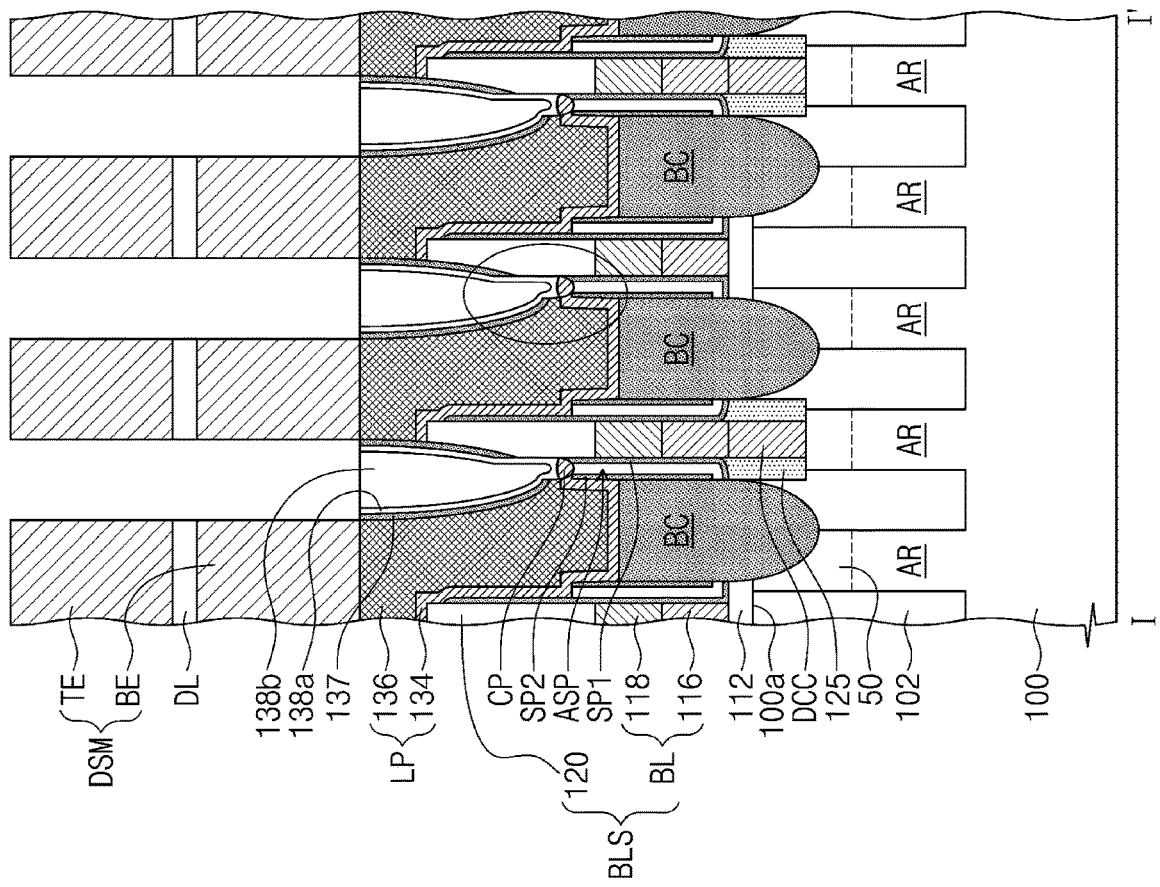
FIG. 2A shows cross-sectional views taken along lines I-I' and II-II' of FIG. 1 illustrating a semiconductor memory device according to an exemplary embodiment of the present inventive concept.

FIG. 1 is a layout view illustrating a semiconductor memory device according to an exemplary embodiment of the present inventive concept. FIG. 2A is a cross-sectional view taken along lines I-I' and II-II' of FIG. 1 illustrating a semiconductor memory device according to exemplary embodiment of the present inventive concept.

Referring to FIGS. 1 and 2A, a device isolation layer 102 may be disposed in a substrate 100. The substrate 100 may be a bulk silicon substrate, a silicon on insulator (SOI) substrate, a germanium substrate, a germanium on insulator (GOI) substrate, a silicon-germanium substrate, a III-V group compound semiconductor substrate, or an epitaxial thin-film substrate obtained by performing a selective epitaxial growth (SEG) process.

The device isolation layer 102 may include an insulating material (e.g., silicon oxide). The device isolation layer 102 may define a plurality of active regions AR of the substrate 100. The plurality of active regions AR each may have a bar shape elongated in a third direction Z. The active regions AR may be parallel to each other in the third direction Z. The layout view of FIG. 1 may be described using a first direction X and a second direction Y. The third direction Z may be a direction between the first direction X and the second direction Y. The first, second and third directions X, Y and Z are extended on the same plane.

Source/drain regions 50 may be disposed in the active regions AR. For example, each of the source/drain regions 50 may be disposed in one of the active regions AR. The source/drain regions 50 may have conductivity different from conductivity of the substrate 100. For example, the source/drain regions 50 may have N-type conductivity and the substrate 100 may have P-type conductivity.

Word lines WL may be disposed in the substrate 100. Two word lines WL may run across one active region AR in the first direction X crossing the third direction Z. The word lines WL may have top surfaces lower than a top surface 100a of the substrate 100. For example, the word lines WL may be buried in the substrate 100. The word lines WL may be formed of a conductive material, for example, impurity-doped polysilicon, metal, or metal silicide.

Gate dielectric layers 108 may be disposed in the substrate 100. For example, each of the gate dielectric layers 108 may be between the substrate 100 and sidewalls of one of the word lines WL and between the substrate 100 and a bottom surface of one of the word lines WL. The gate dielectric layers 108 may include, for example, a silicon oxide layer, a thermal oxide layer, or a high-k dielectric layer.

Gate protection patterns 110 may be disposed on top surfaces of the word lines WL and top surfaces of the gate dielectric layers 108. For example, each of the gate protection patterns 110 may be disposed on top surfaces of one of the word lines WL and one of the gate dielectric layers 108. The gate protection patterns 110 each may have a top surface at substantially the same level as the top surface 100a of the substrate 100. The gate protection patterns 110 may include an insulating material (e.g., silicon oxide).

A buffer layer 112 may be disposed on the top surface 100a of the substrate 100. The buffer layer 112 may cover the top surfaces of the gate protection patterns 110. The buffer layer 112 may include one or more insulation layers. For example, the buffer layer 112 may include a silicon oxide layer, a silicon nitride layer, a silicon oxynitride layer, or a combination thereof.

Bit line node contacts DCC may be disposed on the active regions AR. For example, each of the bit line node contacts DCC may be disposed on a central portion of one of the active regions AR between two adjacent word lines WL of the word lines WL running across the one of the active regions AR. For example, two adjacent word lines WL of the word lines WL may extend in the first direction (X-axis) over the one of the active regions AR. In this case, one of the bit line node contacts DCC may be disposed at the central portion of the one of the active regions AR, the one of the bit line node contacts DCC being disposed between one of the two adjacent word lines WL and the other of the two adjacent word lines WL and the one of the bit line node contacts DCC partially overlapping the two adjacent word lines WL. Each of the bit line node contacts DCC may penetrate the buffer layer 112 to be electrically connected to one of the active regions AR. For example, each of the bit line node contacts DCC may be electrically connected to one of the source/drain regions 50 between one of two adjacent word lines WL and the other of the two adjacent word lines WL. Each of the bit line node contacts DCC may have a bottom surface at a level between the top surface 100a of the substrate 100 and the top surfaces of the word lines WL. The bit line node contacts DCC may include, for example, impurity-doped polysilicon.

Buried patterns 125 each may be buried in a central portion of one of the active regions AR and may cover a sidewall of one of the bit line node contacts DCC. The buried patterns 125 may include, for example, silicon nitride. In an exemplary embodiment, the bit line node contacts DCC each may be disposed between two adjacent buried patterns 125, each of which is disposed under one of air spacers ASP.

Bit line structures BLS may be disposed extending in a second direction Y crossing the first and third directions X and Z. The first direction X, the second direction Y and the third direction Z may be in a same plane. The bit line structures BLS may overlap the bit line contacts DCC arranged in the second direction Y. For example, each of the bit line structures BLS may be electrically connected to a predetermined number of the bit line node contacts DCC arranged in the second direction Y.

Each of the bit line structures BLS may include a bit line BL and an insulation pattern 120 that are sequentially stacked on one of the bit line node contacts DCC. The bit line BL may include a first conductive pattern 116 and a second conductive pattern 118 stacked on each other. The first conductive pattern 116 may include, for example, impurity-doped polysilicon. The second conductive pattern 118 may include, for example, tungsten (W), aluminum (Al), copper (Cu), nickel (Ni), or cobalt (Co). The insulation pattern 120 may be disposed on the second conductive patterns 118. In this case, the second conductive pattern 118 may be interposed between the first conductive pattern 116 and the insulation pattern 120. The insulation pattern 120 may include, for example, a silicon oxide layer. As not shown in figures, a diffusion barrier layer may be disposed between the first conductive pattern 116 and the second conductive pattern 118.

Storage node contacts BC may be disposed on the active regions AR. In an exemplary embodiment, a pair of storage node contacts BC may overlap one of the active regions AR. For example, one of the pair of storage node contacts BC may overlap a first end portion AR-1E of the one of the active regions AR, and the other of the pair of storage node contacts BC may overlap a second end portion AR-2E of the one of the active regions AR. In this case, the first end portion AR-1E and the second end portion AR-2E may be arranged along in parallel to the third direction Z. The pair of storage node contacts BC may be electrically connected to a pair of the source/drain regions 50 disposed in each of the active regions AR. One of the pair of the source/drain regions 50 may be disposed in the first end portion AR-1E of the one of the active regions AR. The other of the pair of the source/drain regions 50 may be disposed in the second end portion AR-2E of the one of the active regions AR.

Each of the pair of storage node contacts BC may have a lower portion that penetrates through the buffer layer 112, extending into one of the pair of the source/drain regions 50 disposed in each of the active regions AR. Each of the storage node contacts BC may have a top surface higher than a top surface of the buffer layer 112. The storage node contacts BC may include, for example, impurity-doped polysilicon.

Separation patterns 130 each may be disposed at an intersection where each of the word lines WL intersects a space between two adjacent bit line structures BLS. For example, each of the separation patterns 130 may be disposed on the buffer layer 112 and between two storage node contacts BC adjacent to each other in the second direction Y. The separation patterns 130 may include, for example, SiBCN, SiCN, SiOCN, or SiN.

Landing pads LP each may be disposed on one of the storage node contacts BC. For example, each of the landing pads LP may be electrically connected to one of the storage node contacts BC. The landing pads LP may be physically and electrically spaced apart from each other. Each of the landing pads LP may shift in the first direction X relative to a center of one of the storage node contacts BC. For example, each of the landing pads LP may overlap one of the storage node contacts BC and a center of each of the landing pads LP need not coincide with the center of the one of the storage node contacts BC. Accordingly, the landing pads LP each may have a portion overlapping its adjacent one of the bit line structure BLS and another portion overlapping its adjacent one of the storage node contacts BC. The landing pads LP each may include a barrier pattern 134 and a metal pattern 136 that are sequentially stacked on one of the storage node contacts BC. The barrier pattern 134 may include, for example, TiN, Ti/TiN, TiSiN, TaN, or WN. The metal pattern 136 may include, for example, tungsten (W).

Residual patterns 137 each may surround a sidewall of one of the landing pads LP. For example, the landing pads LP each may have a sidewall and a lower portion adjacent to one of the storage node contacts BC. The lower portion of each of the landing pads LP may be partially exposed through one of the residual patterns 137. For example, the residual patterns 137 each may expose a portion of the barrier pattern 134 and a portion of the metal pattern 136 at the lower portion of each of the landing pads LP. The residual patterns 137 may include an insulating material (e.g., silicon nitride).

A first spacer SP1 and a second spacer SP2 may be sequentially disposed on a sidewall of each of the bit line structures BLS. The first and second spacers SP1 and SP2 may extend in the second direction Y along the sidewall of each of the bit line structures BLS. For example, the first spacer SP1 may extend in the second direction Y between one of the landing pads LP and the bit line BL adjacent to the one of the landing pads LP and between one of the storage node contacts BC and the bit line BL adjacent to the one of the storage node contacts BC. The second spacer SP2 may extend between the one of the landing pads LP and the first spacer SP1 and between the first spacer SP1 and one of the storage node contacts BC. Portions of the first and second spacers SP1 and SP2 may be disposed in a space between the landing pads LP adjacent to each other in the first direction X. A combined structure of the barrier pattern 134 and the metal pattern 136 may have a first portion constituting a lower sidewall of each of the landing pads LP, and a second portion exposed through the residual pattern 137 and the second spacer SP2 to a space between the landing pads LP adjacent to each other in the first direction X. The first and second spacers SP1 and SP2 may include, for example, silicon nitride.

Capping patterns CP each may be disposed between a sidewall of one of the insulation pattern 120 and the lower sidewall of one of the landing pads LP. In an exemplary embodiment, the capping patterns CP each may be in contact with the sidewall of one of the insulation patterns 120 and the lower sidewall of one of the landing pads LP. In an exemplary embodiment, the capping patterns CP each may be in contact with the sidewall of one of the insulation patterns 120, the lower sidewall of one of the landing pads LP, and top surfaces of the first and second spacers SP1 and SP2. In this configuration, the capping patterns CP each may be in contact with a portion of the barrier pattern 134, a portion of the metal pattern 136, or a portion of both, that constitute the lower sidewall of one of the landing pads LP. For example, the capping patterns CP each may be in contact with at least one of the metal pattern 136 and the barrier pattern 134.

Figure 2B:
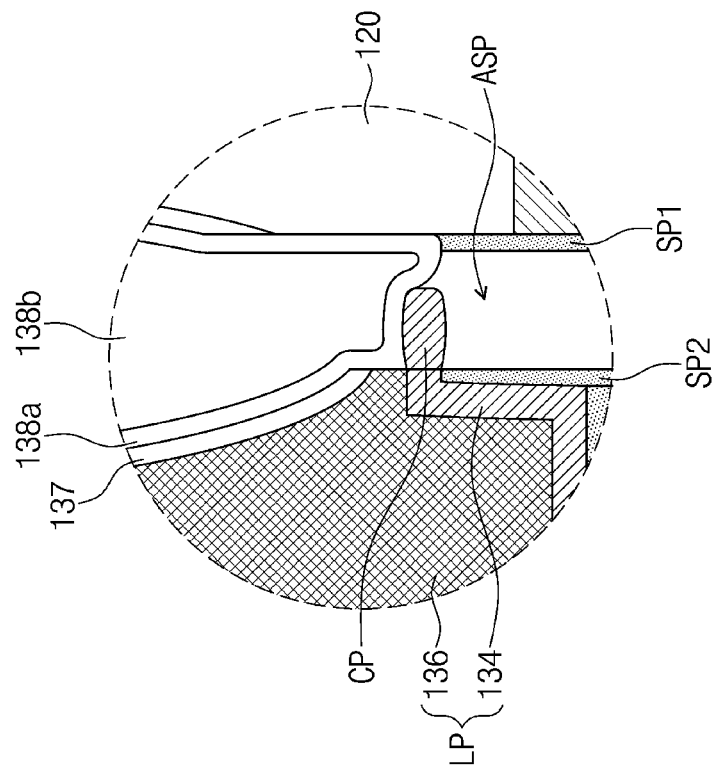
FIG. 2B shows an expanded view of a circled portion of FIG. 2A according to an exemplary embodiment of the present inventive concept.

In an exemplary embodiment, the capping patterns CP each may be in contact with the lower sidewall of one of the landing pads LP, but spaced apart from the sidewall of one of the insulation patterns 120. (FIGS. 2B and 3B). In this case, a first gap-fill layer 138a may cover an upper surface of an air spacer ASP. The first gap-fill layer 138a and the air spacer ASP will be described later.

In an exemplary embodiment, the capping patterns CP each may be in contact with the lower sidewall of one of the landing pads LP and the top surface of the second spacer SP2, but spaced apart from the top surface of the first spacer SP1 and the sidewall of one of the insulation patterns 120. (FIG. 2B).

In an exemplary embodiment, the capping patterns CP each may be in contact with the lower sidewall of one of the landing pads LP, but spaced apart from the sidewall of one of the insulation patterns 120 and the top surfaces of the first and second spacers SP1 and SP2. (FIG. 3B). In this configuration, the capping patterns CP each may be in contact with a portion of the barrier pattern 134 or a portion of the metal pattern 136. The portion of the barrier pattern 134 and the portion of the metal pattern 136 may constitute the lower sidewall of the landing pad LP.

In an exemplar embodiment, the capping patterns CP each may include metal nitride selectively grown on the lower sidewall of one of the landing pads LP. For example, the capping patterns CP may include a material, which is the same as a material of the barrier pattern 134, selectively grown on a portion of the barrier pattern 134 exposed through the residual pattern 137 and the second spacer SP2. In this case, the capping patterns CP each may extend away from the portion of the barrier pattern 134. For example, the capping patterns CP may include TiN. The present inventive concept is not limited thereto. For example, the capping patterns CP may include Ti/TiN.

The capping patterns CP each may partially or completely cover or close an upper portion of a space between the first and second spacers SP1 and SP2. The capping patterns CP each may therefore define an air spacer ASP between the first and second spacers SP1 and SP2. For example, the capping patterns CP each may define a top surface of the air spacer ASP, and the first and second spacers SP1 and SP2 may define sidewalls of the air spacer ASP. The air spacer ASP may be filled with air. The air spacer ASP may extend in the second direction Y between the first and second spacers SP1 and SP2. For example, the top surface of the air spacer ASP may be positioned higher than the top surface of the storage node contact BC.

A first gap-fill layer 138a and a second gap-fill layer 138b may sequentially fill a space between two adjacent landing pads LP. The first gap-fill layer 138a may surround outer sidewalls of the landing pads LP. The second gap-fill layer 138b may be disposed on the first gap-fill layer 138a and completely fill the space between the two adjacent landing pads LP. For example, the first and second gap-fill layers 138a and 138b may include TEOS (tetraethylorthosilicate), high density plasma (HDP) oxide, silicon oxide, silicon nitride, or silicon carbonitride.

Data storage members DSM may be disposed on the landing pads LP. The data storage members DSM each may be, for example, a capacitor. The capacitor may include a bottom electrode BE, a dielectric layer DL, and a top electrode TE. For example, the bottom electrodes BE may be arranged in a zigzag manner along the second direction Y.

Figure 3A:
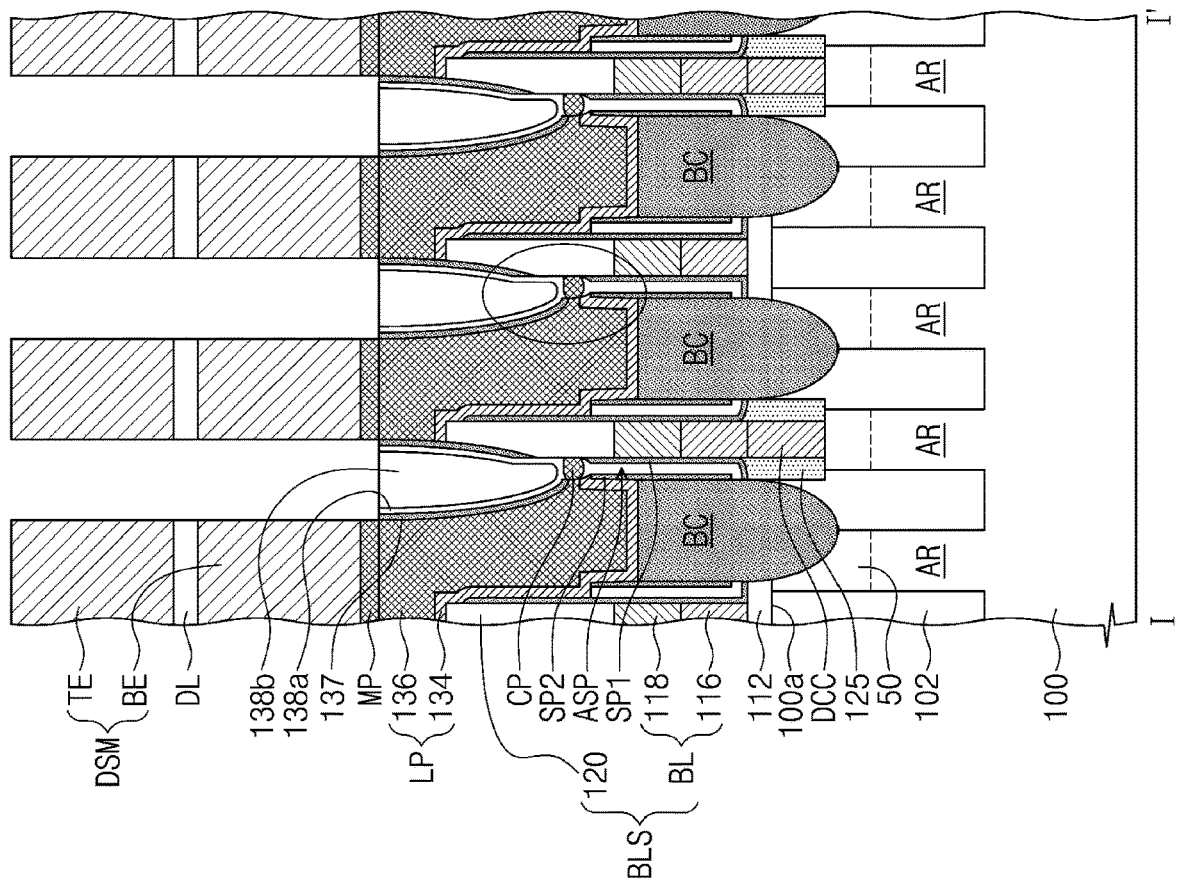
FIG. 3A shows cross-sectional views taken along lines I-I' and II-II' of FIG. 1 illustrating a semiconductor memory device according to an exemplary embodiment of the present inventive concept.
Figure 3B:
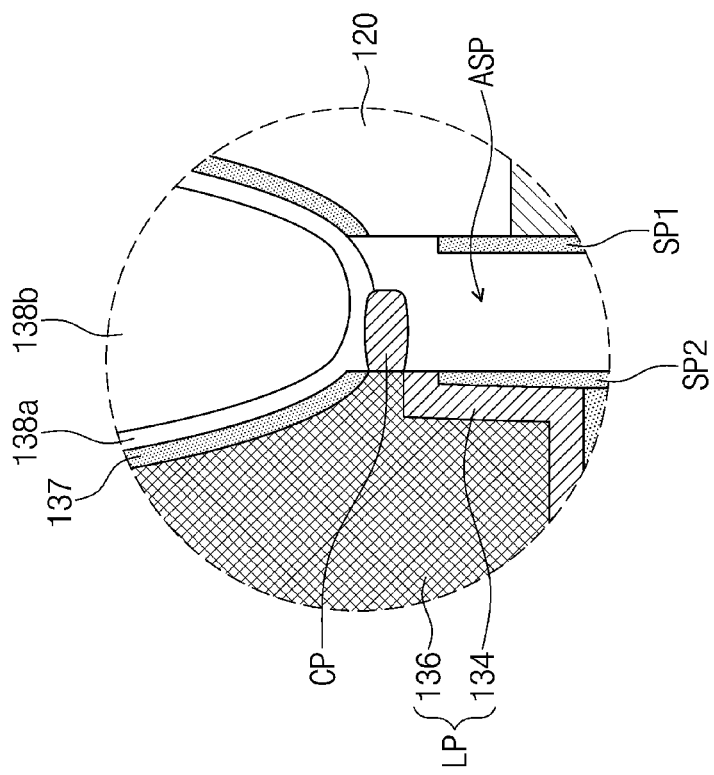
FIG. 3B shows an expanded view of a circled portion of FIG. 3A according to an exemplary embodiment of the present inventive concept.

FIG. 3A is a cross-sectional view taken along lines I-I' and II-II' of FIG. 1 illustrating a semiconductor memory device according to an exemplary embodiment of the present inventive concept. For brevity of the description, those components substantially the same as those discussed in the semiconductor memory device of FIG. 2 are allocated the same reference numerals thereto, and a repetitive explanation thereof will be omitted.

Referring to FIG. 3A, the capping patterns CP each may include a metallic material selectively grown on the lower sidewall of one of the landing pads LP. For example, the capping patterns CP may include a material, which is the same as a material of the metal pattern 136, selectively grown on a portion of the metal pattern 136 exposed through the residual pattern 137 and the second spacer SP2. In this case, the capping patterns CP each may extend away from the portion of the metal pattern 136. For example, the capping patterns CP may include tungsten (W). In this case, the capping patterns CP may be spaced apart from a top surface of the first spacer SP1 and a top surface of the second spacer SP2. (See also, FIG. 3B).

Upper metal patterns MP each may be disposed between the bottom electrode BE and the landing pad LP. The upper metal pattern MP may include the same material as the landing pad LP and the capping pattern CP. The upper metal pattern MP may include, for example, tungsten (W). The present inventive concept is not limited thereto. For example, the upper metal pattern MP may include tungsten (W) and Ti/TiN or tungsten (W) and TiN.

FIGS. 4A to 11A are layout views illustrating a method of fabricating a semiconductor memory device according to an exemplary embodiment of the present inventive concept. FIGS. 4B to 11B and 11C are cross-sectional views taken along lines I-I' and II-II' of FIGS. 4A to 11A illustrating a method of fabricating a semiconductor memory device according to an exemplary embodiment of the present inventive concept.

Figure 4A:
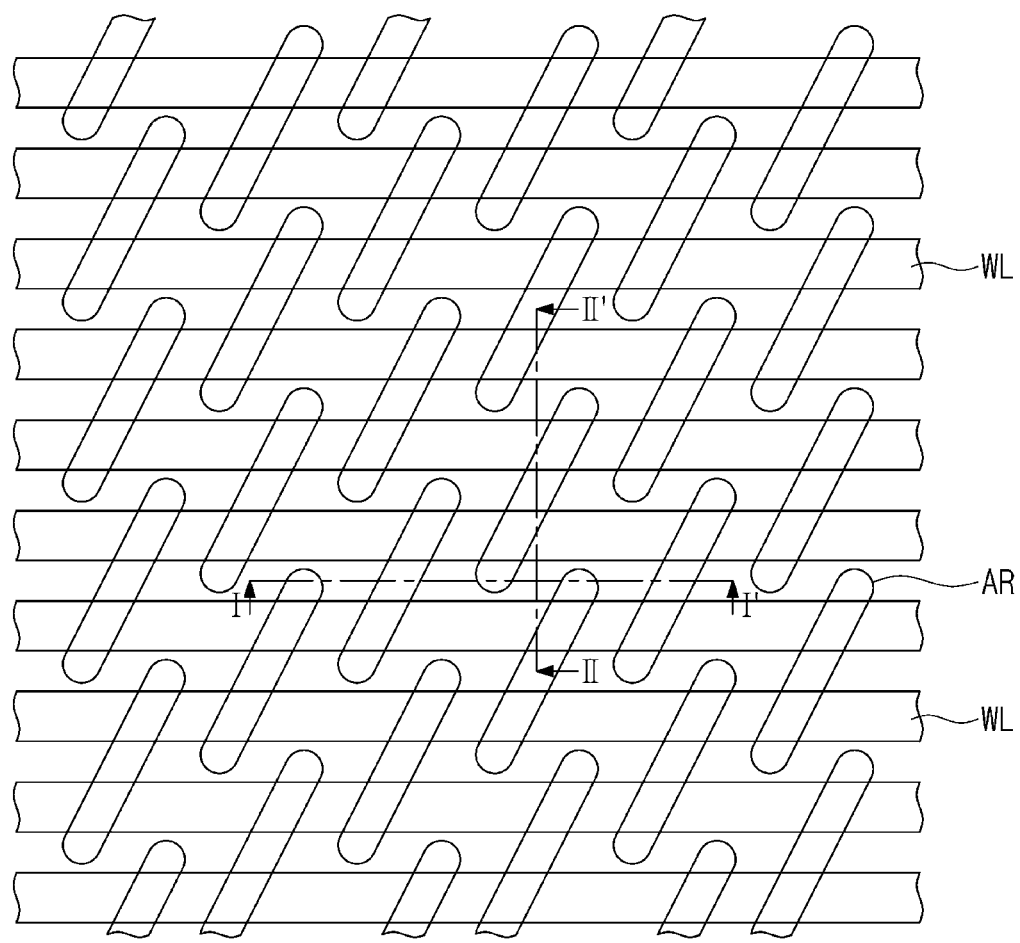
Figure 4B:
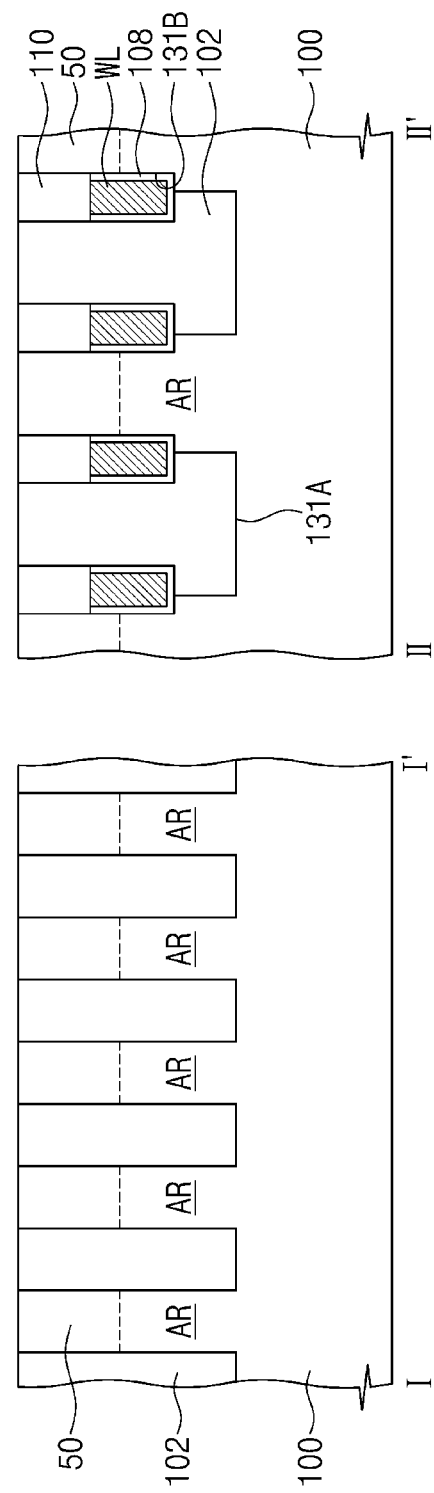

Referring to FIGS. 4A and 4B, active regions AR may be defined by forming a device isolation layer 102 in a substrate 100. The device isolation layer 102 may be formed by forming first trenches 131A in the substrate 100 and then filling the first trenches 131A with an insulating material. The active regions AR each may have a bar shape elongated in a third direction Z and be disposed in parallel to each other. The substrate 100 may be a bulk silicon substrate, a silicon on insulator (SOI) substrate, a germanium substrate, a germanium on insulator (GOI) substrate, a silicon-germanium substrate, or an epitaxial layer substrate obtained by performing selective epitaxial growth (SEG). The device isolation layer 102 may include, for example, silicon oxide, silicon nitride, or silicon oxynitride.

Source/drain regions 50 may be formed in the active regions AR. The source/drain regions 50 may be formed in non-overlapped regions between the active regions AR and word lines WL. For example, three source/drain regions 50 may be formed in each of the active regions AR. The source/drain regions 50 may be formed by forming an ion implantation mask (not shown) on the substrate 100 and then performing an ion implantation process on the substrate 100 exposed through the ion implantation mask. Alternatively, the ion implantation process may be carried out without the ion implantation mask. The source/drain regions 50 may have conductivity (e.g., N-type) different from that of the substrate 100.

Second trenches 131B may be formed in the substrate 100 having the device isolation layer 102. A pair of the second trenches 131B may be formed running across each of the active region AR in a first direction X crossing the third direction Z. The second trenches 131B may be parallel to each other. A gate dielectric layer 108 may be formed to conformally cover a surface of each of the second trenches 131B. The gate dielectric layer 108 may include an insulating material layer, for example, a silicon oxide layer, a thermal oxide layer, or a high-k dielectric layer.

The word lines WL may be formed in the second trenches 131B including the gate dielectric layer 108 formed therein. The word lines WL may be formed by forming on the gate dielectric layer 108 a metal layer (not shown) to fill the second trenches 131B and then performing an etch process on the metal layer to leave portions of the metal layer on lower portions of the second trenches 131B. For example, the metal layer may be recessed so that top surfaces of the word lines WL are positioned below a top surface of the substrate 100 in the etch process. In this case, the second trenches 131B may be partially filled with the word lines WL at lower portions of the second trenches 131B. In an exemplary embodiment, the gate dielectric layer 108 may be etched at substantially the same time with the metal layer in the etch process. The word lines WL may include a conductive material, for example, doped polysilicon, metal, or metal silicide.

Gate protection patterns 110 may be formed to fill remaining portions of the second trenches 131B. The gate protection patterns 110 each may be formed on one of the word lines WL and may completely fill the second trenches 131B. For example, a combined structure of one of the word lines WL and one of the gate protection patterns 110 stacked on each other may fill completely one of the second trenches 131B. The gate protection patterns 110 may include, for example, silicon oxide, silicon nitride, or silicon oxynitride.

Figure 5A:
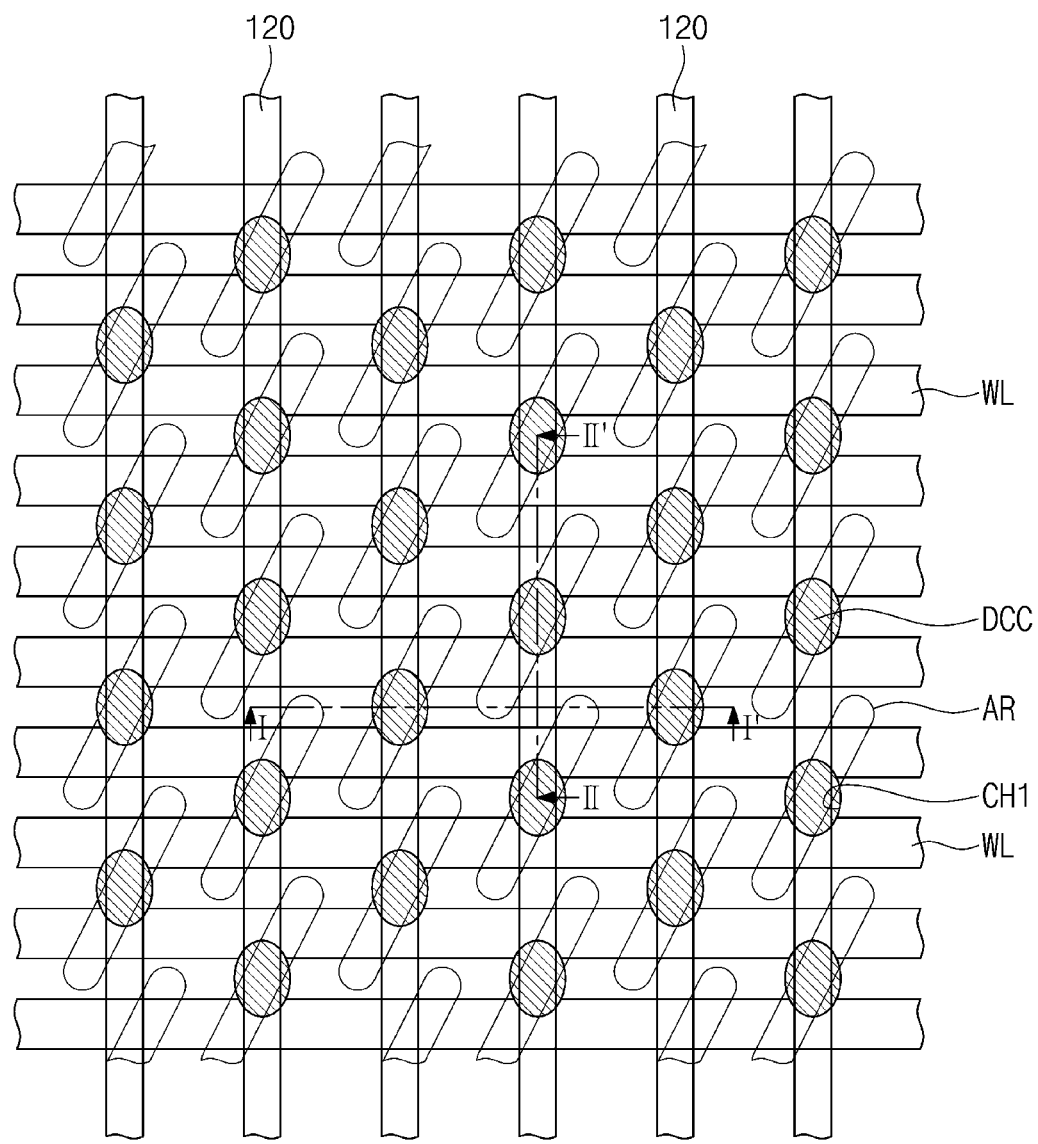
Figure 5B:
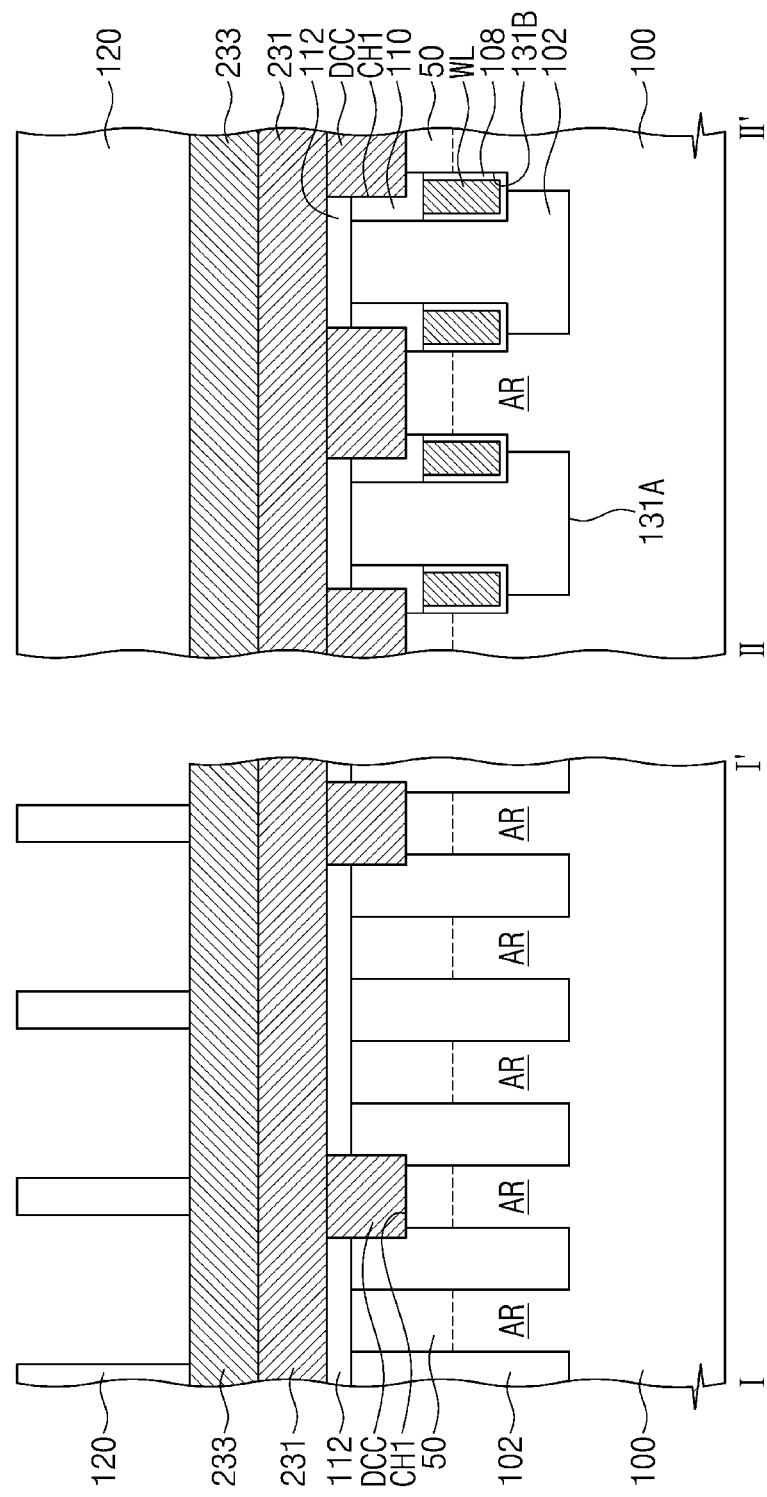

Referring to FIGS. 5A and 5B, a buffer layer 112 may be formed on the substrate 100. For example, the buffer layer 112 may be formed on the resulting structure of FIGS. 4A and 4B. The buffer layer 112 may include one or more insulation layers. The buffer layer 112 may include, for example, a silicon oxide layer, a silicon nitride layer, a silicon oxynitride layer, or a combination thereof. As not shown in figures, a mask pattern including openings may be formed on the buffer layer 112. For example, the openings of the mask pattern may define regions where bit line node contacts DCC are to be formed.

An etch process may be performed to pattern the substrate 100 and the buffer layer 112 exposed through the mask pattern. The etch process may partially etch the buffer layer 112 and an upper portion of the substrate 100 to form first contact holes CH1 in the active regions AR. For example, the first contact holes CH1 each may be formed by etching a central portion of each of the active regions AR that is exposed between one of a pair of word lines WL and the other of the pair of word lines WL. The pair of word lines WL may be disposed on one of the active regions AR, running across the one of the active regions AR. The etch process may therefore expose the source/drain regions 50 formed in the central portions of the active regions AR. The etch process for forming the first contact holes CH1 may also partially etch an upper portion of the device isolation layer 102 adjacent to the source/drain region 50. For example, the source/drain region 50 formed in the central portion of the active region AR may be shared by a pair of word lines WL disposed on the active region AR.

The bit line node contacts DCC each may be formed in one of the first contact holes CH1. The bit line node contacts DCC may completely fill the first contact holes CH1. For example, the bit line node contacts DCC each may be formed by forming on the buffer layer 112 a conductive layer (not shown) to fill the first contact holes CH1 and then performing a planarization process (e.g., CMP or etch-back) on the conductive layer until exposing a top surface of the buffer layer 112. The bit line node contacts DCC may include impurity-doped polysilicon, metal silicide, polysilicide, metal nitride, or metal.

A first electrode layer 231 and a second electrode layer 233 may be sequentially formed on the buffer layer 112. The first electrode layer 231 may include, for example, impurity-doped polysilicon. The second electrode layer 233 may include, for example, tungsten (W), aluminum (Al), copper (Cu), nickel (Ni), or cobalt (Co). As not shown in figures, a diffusion barrier layer may be formed between the first and second electrode layers 231 and 233. The diffusion barrier layer may include a diffusion barrier metal, for example, TiN, Ti/TiN, TiSiN, TaN, or WN.

Insulation patterns 120 may be formed on the second electrode layer 233. The insulation patterns 120 may extend in a second direction Y crossing the first and third directions X and Z, and may be in parallel to each other. Each of the insulation patterns 120 may run across the active regions AR to pass over the bit line node contacts DCC arranged in the second direction Y. The insulation patterns 120 may include, for example, silicon oxide or silicon nitride.

Figure 6A:
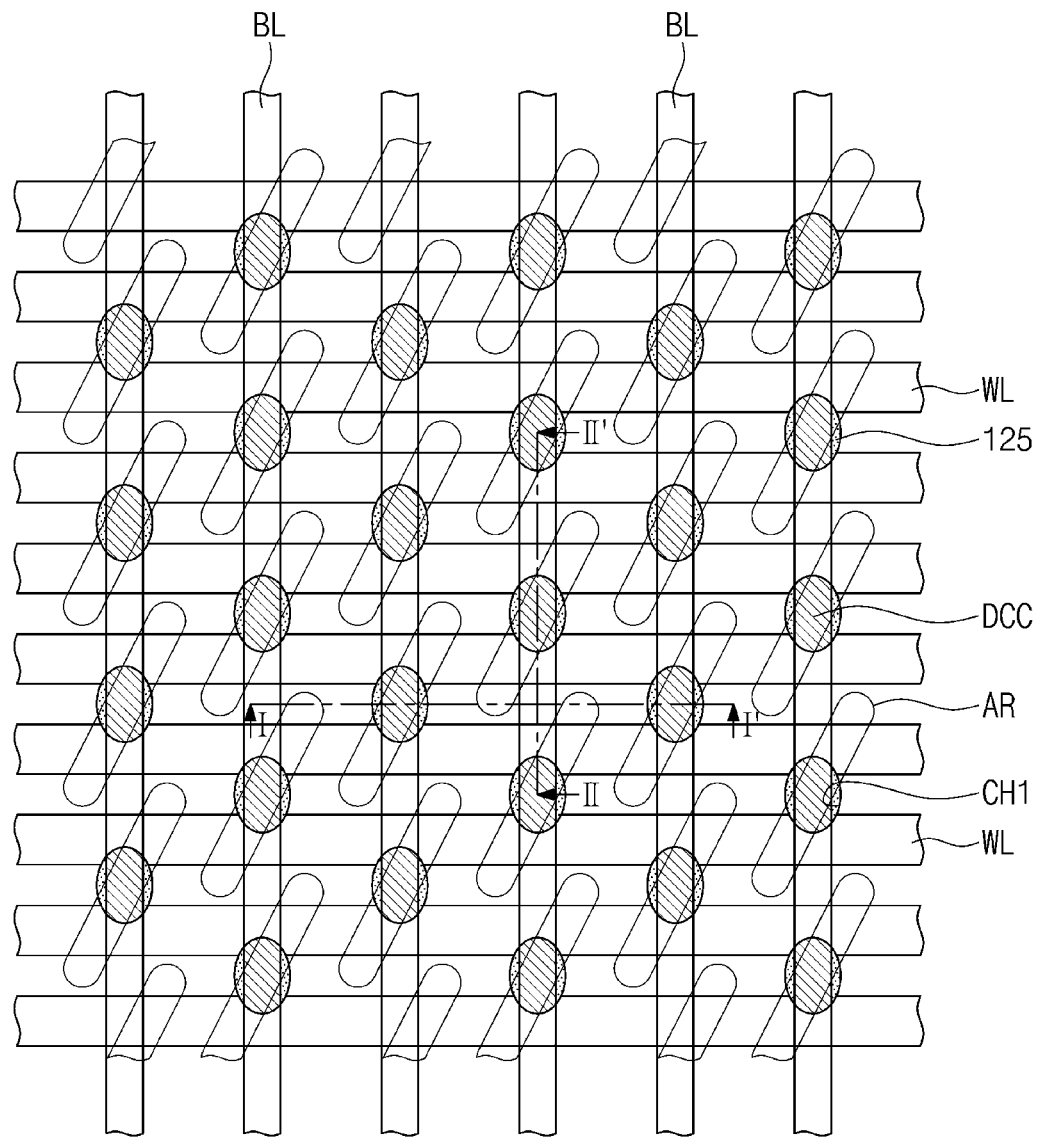
Figure 6B:
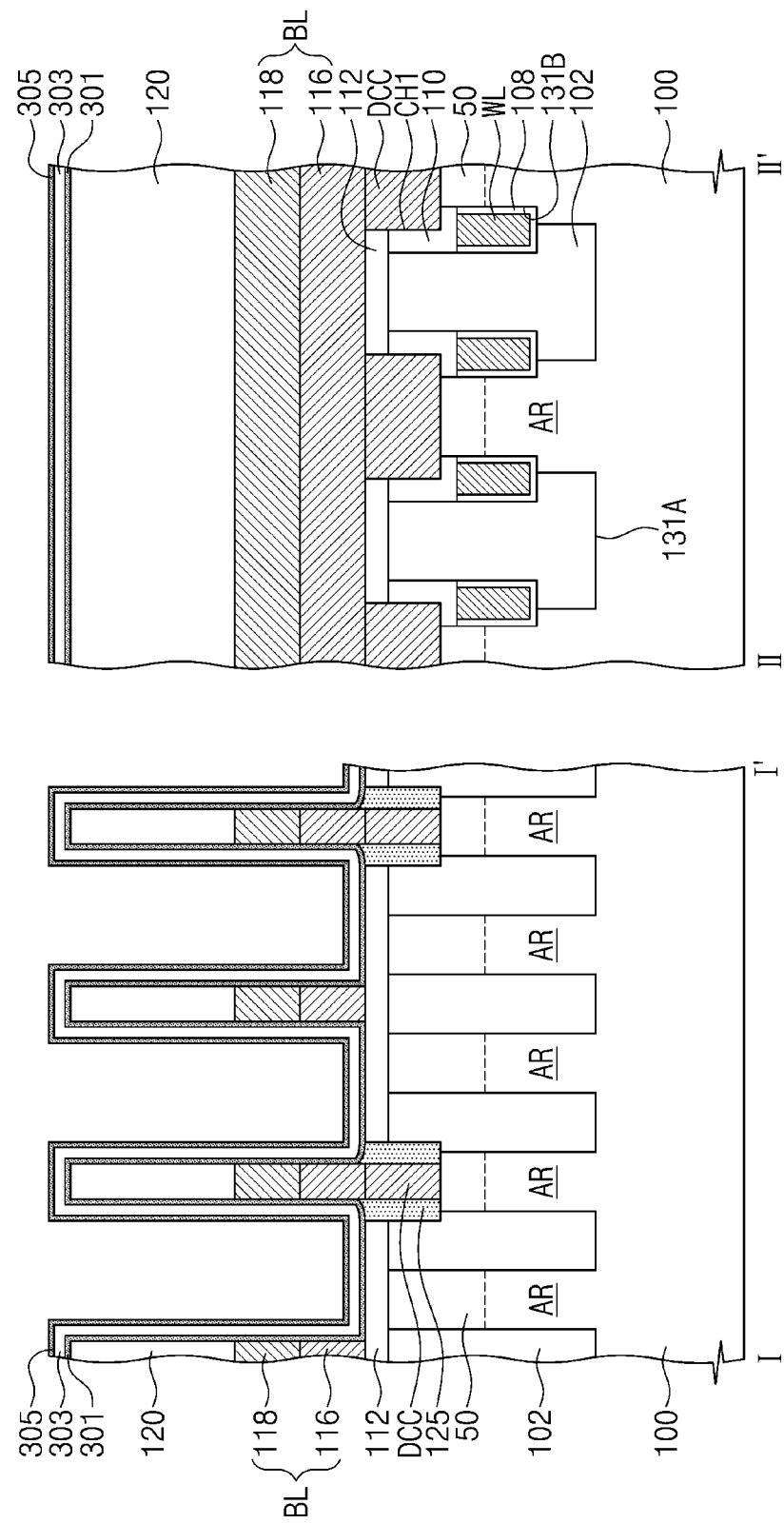

Referring to FIGS. 6A and 6B, bit lines BL may be formed by using the insulation patterns 120 as an etch mask to sequentially pattern the second electrode layer 233 and the first electrode layer 231. Each of the bit lines BL may include a first conductive pattern 116 and a second conductive pattern 118 that are sequentially formed on the substrate 100 when the first electrode layer 231 and the second electrode layer 233 are patterned, respectively. The bit lines BL each may run across the active regions AR in the second direction Y and pass over the bit line node contacts DCC arranged in the second direction Y.

After the bit lines BL are formed, an etch process may be performed to partially etch the bit line node contacts DCC exposed through the bit lines BL, thereby reducing a width of each of the bit line node contacts DCC. Due to the reduction of the width of the bit line node contact DCC, a hollow space may be formed between each of the first contact holes CH1 and each of the bit line node contacts DCC. For example, the hollow space may be formed within each of the first contact holes CH1.

Buried patterns 125 may be formed in the hollow space of each of the first contact holes CH1. The buried patterns 125 may be formed by forming an insulation layer to completely fill the first contact hole CH1 and to cover sidewalls of the bit lines BL and sidewalls and top surfaces of the insulation patterns 120, and then by performing an etch process on the insulation layer. Through these processes, the buried patterns 125 may be locally formed in the first contact hole CH1. The buried patterns 125 may include, for example, silicon nitride.

A first spacer layer 301 may be formed to conformally cover the sidewalls of the bit lines BL, the sidewalls and top surfaces of the insulation patterns 120, and the top surface of the buffer layer 112. The first spacer layer 301 may include, for example, silicon nitride. A sacrificial spacer layer 303 may be formed on the first spacer layer 301. The sacrificial spacer layer 303 may conformally cover a surface of the first spacer layer 301. The sacrificial spacer layer 303 may include a material having etch selectivity with respect to the first spacer layer 301. For example, the sacrificial spacer layer 303 may include silicon oxide. A second spacer layer 305 may be formed on the sacrificial spacer layer 303. The second spacer layer 305 may conformally cover a surface of the sacrificial spacer layer 303. The second spacer layer 305 may include a material having etch selectivity with respect to the sacrificial spacer layer 303. For example, the second spacer layer 305 may include silicon nitride.

Figure 7A:
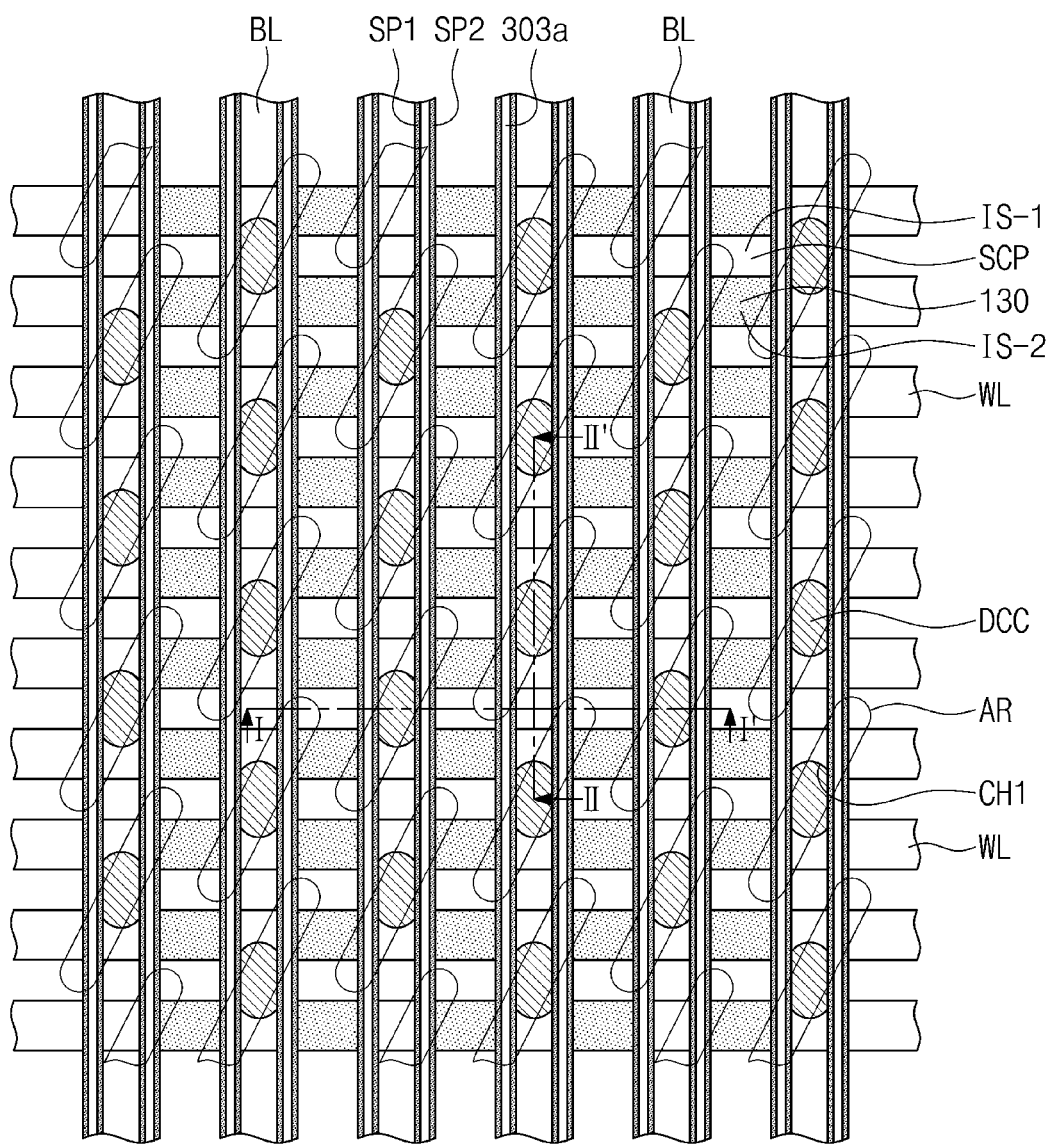
Figure 7B:
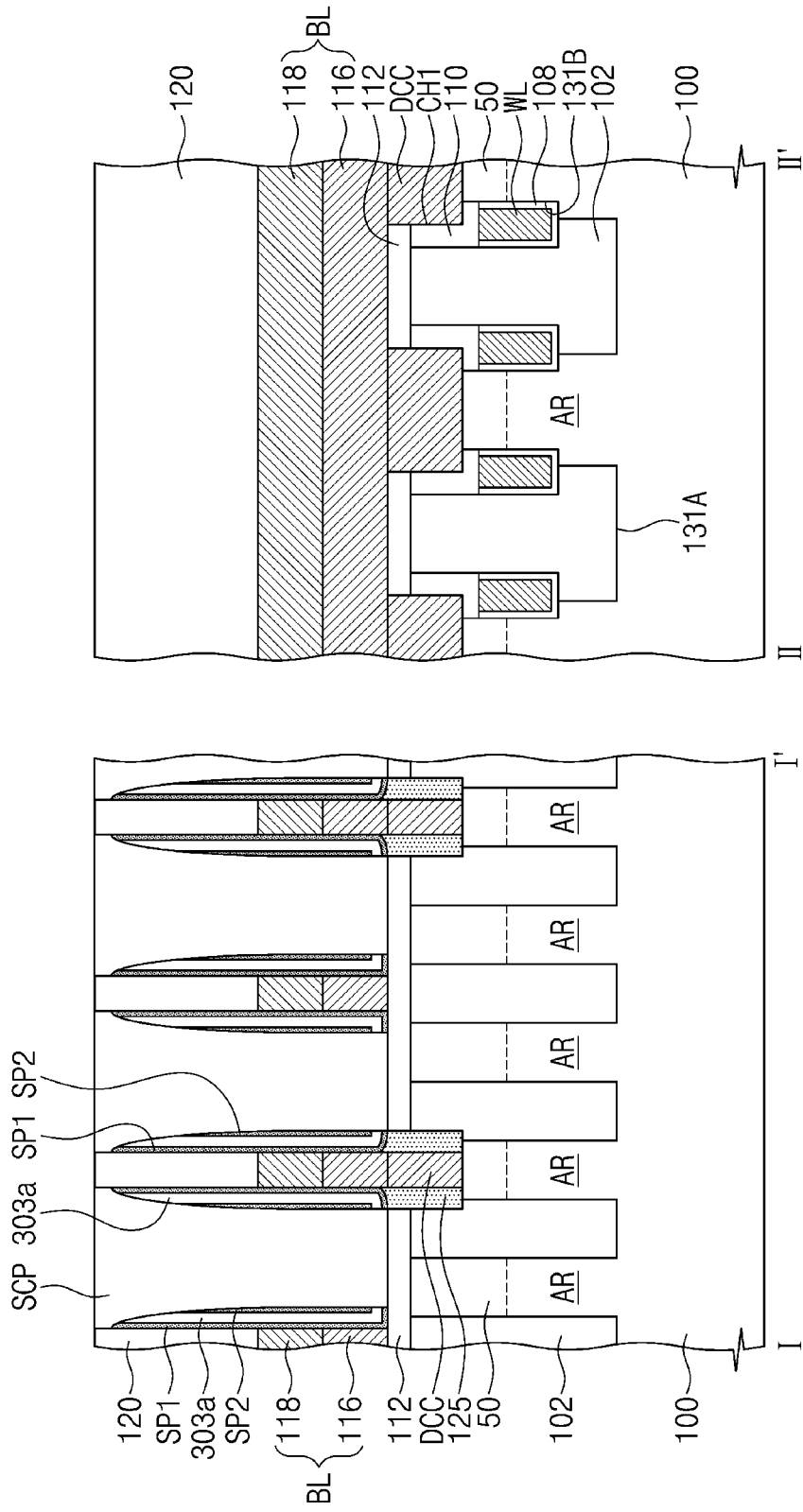

Referring to FIGS. 7A and 7B, an etch-back process may be performed on the resulting structure of FIGS. 6A and 6B. For example, in the etch-back process, the second spacer layer 305, the sacrificial spacer layer 303, and the first spacer layer 301 may be sequentially etched and the top surfaces of the insulation patterns 120 and the top surface of the buffer layer 112 may be exposed. Accordingly, first spacers SP1, sacrificial spacers 303a, and second spacers SP2 may be formed on the sidewalls of the bit lines BL and the sidewalls of the insulation patterns 120.

Sacrificial patterns SCP may be formed at first intersections IS-1 where end portions of the active regions AR intersect spaces between the bit lines BL. For example, the first intersections IS-1 each may be a region where one end portion of each of the active regions AR and a space defined between two adjacent bit lines BL overlap each other. The space may be extended in parallel to the two adjacent bit lines BL along the second direction (Y-axis). In addition, separation patterns 130 may be formed at second intersections IS-2 where the word lines WL intersect the spaces between the bit lines BL. For example, the second intersections IS-2 each may be a region where each of the word lines WL and the space defined between two adjacent bit lines BL overlap each other. The sacrificial patterns SCP may be formed by forming an insulation layer (not shown) to fill the spaces between the bit lines BL and then performing a planarization process on the insulation layer. The separation patterns 130 may be formed to fill spaces between the sacrificial patterns SCP adjacent to each other in the second direction Y. The top surfaces of the insulation patterns 120 may be coplanar with top surfaces of the sacrificial pattern SCP and top surfaces of the separation pattern 130 at substantially the same height from the top surface of the substrate 100. The separation patterns 130 may include a material having etch selectivity with respect to the sacrificial patterns SCP. In an exemplary embodiment, the separation patterns 130 and the sacrificial patterns SCP may be formed of different materials or different material combinations. The sacrificial patterns SCP may include, for example, silicon oxide, silicon nitride, or silicon oxynitride. The separation patterns 130 may include, for example, SiBCN, SiCN, SiOCN, or SiN.

Figure 8A:
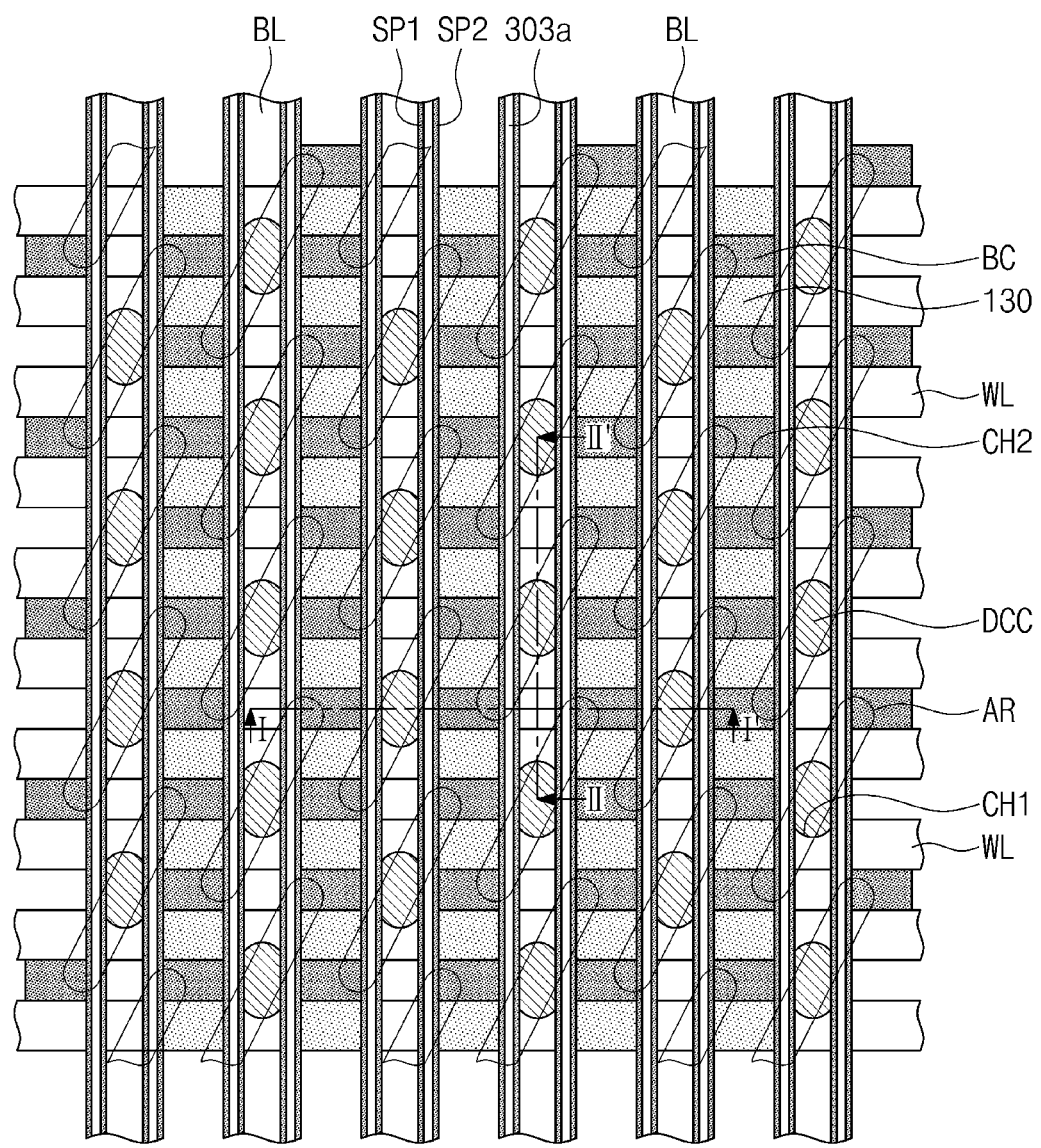
Figure 8B:
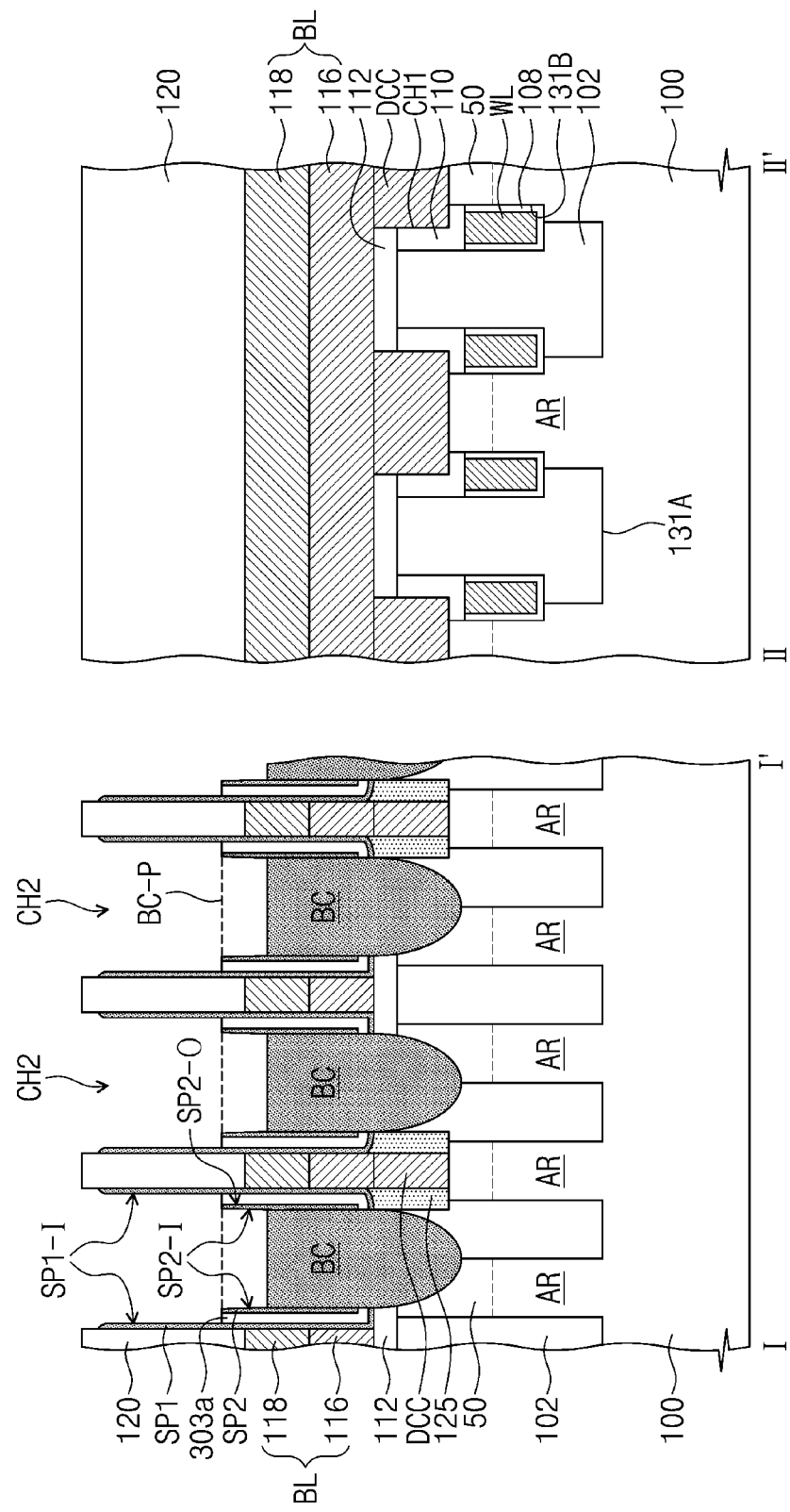

Referring to FIGS. 8A and 8B, second contact holes CH2 may be formed by etching the sacrificial patterns SCP, portions of the buffer layer 112, and a partial upper portion of the substrate 100. The second contact holes CH2 may expose the source/drain regions 50 formed in end portions of the active regions AR. For example, the end portions of the active regions AR may be positioned in the first intersection IS-1 of FIG. 7A. The second contact holes CH2 may expose sidewalls of the second spacers SP2.

Storage node contacts BC may be formed in the second contact holes CH2. The storage node contacts BC may be formed by forming a conductive layer (not shown) to fill the second contact holes CH2 and also to cover the top surfaces of the insulation patterns 120. Then the conductive layer may undergo a planarization process to expose the top surfaces of the insulation patterns 120. Successively, upper portions of the remaining conductive layer localized within the second contact holes CH2 may undergo a first etch process such that the remaining conductive layer may be recessed from the top surfaces of the insulation patterns 120 to form preliminary storage node contacts BC-P. In the first etch process, the second spacers SP2 each may have an inner sidewall SP2-I exposed in one of the second contact holes CH2. For example, the inner sidewall SP2-I of each of the second spacers SP2 may be partially in contact with one of the preliminary storage node contacts BC-P. A top surface of the preliminary storage node contacts BC-P are represented with a dashed line in FIG. 8B. The preliminary storage node contacts BC-P may include, for example, impurity-doped polysilicon.

A second etch process may be performed to etch upper portions of the second spacers SP2 exposed through the preliminary storage node contacts BC-P and also etch upper portions of the sacrificial spacers 303a covering the upper sidewalls of the second spacers SP2. Therefore, the first spacers SP1 each may have an inner sidewall SP-I exposed in one of the second contact holes CH2. For example, the inner sidewall SP1-I of each of the first spacers SP1 may be partially in contact with the sacrificial spacers 303a. The preliminary storage node contacts BC-P may have the top surfaces at the same level as top surfaces of the second spacers SP2 and the sacrificial spacers 303a.

Upper portions of the preliminary storage node contacts BC-P may undergo a third etch process such that the preliminary storage node contacts BC-P may be recessed from the top surfaces of the second spacers SP2 and the top surfaces of the sacrificial spacers 303a to form the storage node contacts BC. Therefore, the inner sidewall SP2-I of each of the second spacers SP2 may be partially exposed by one of the storage node contacts BC.

Figure 9A:
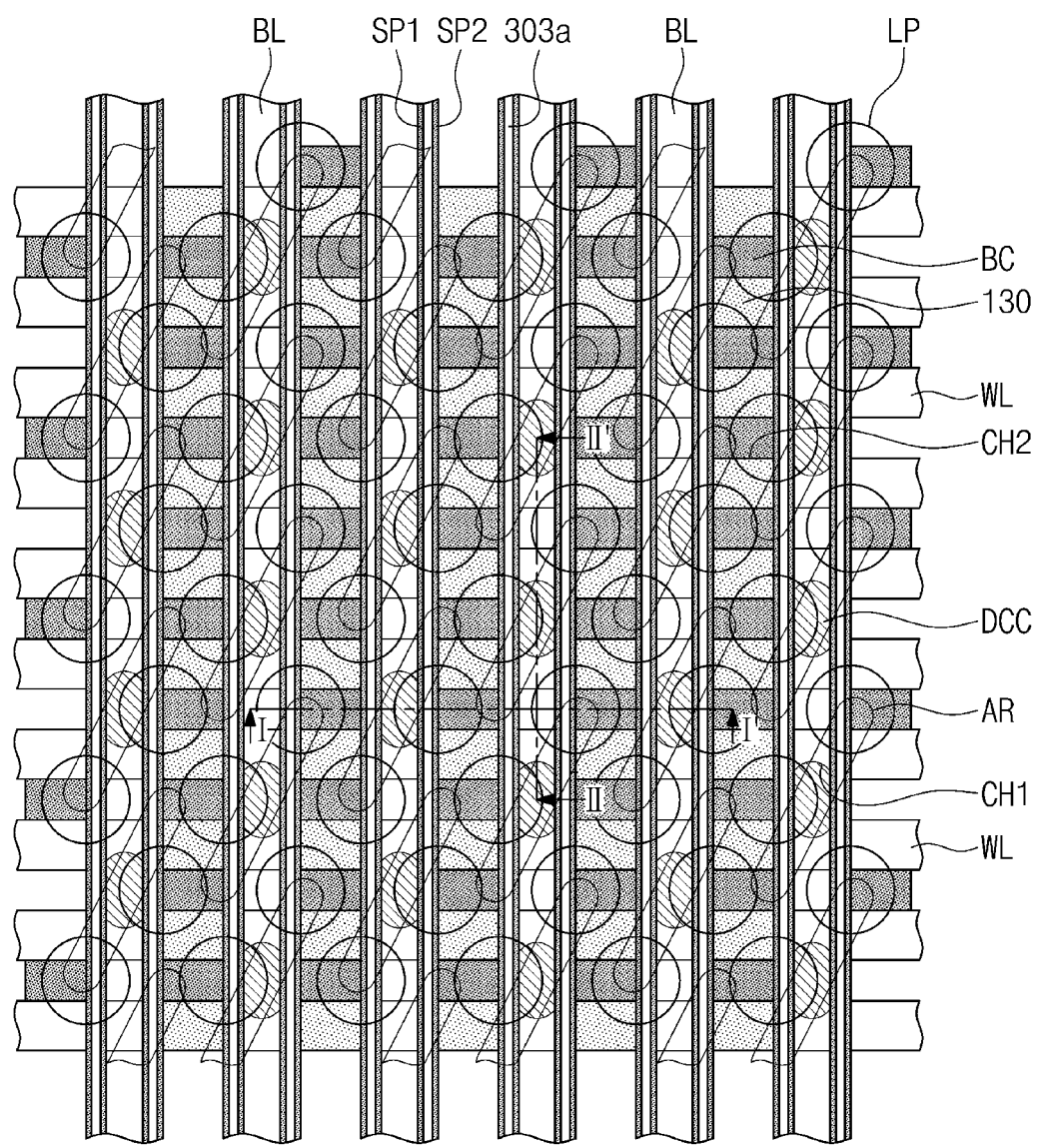
Figure 9B:
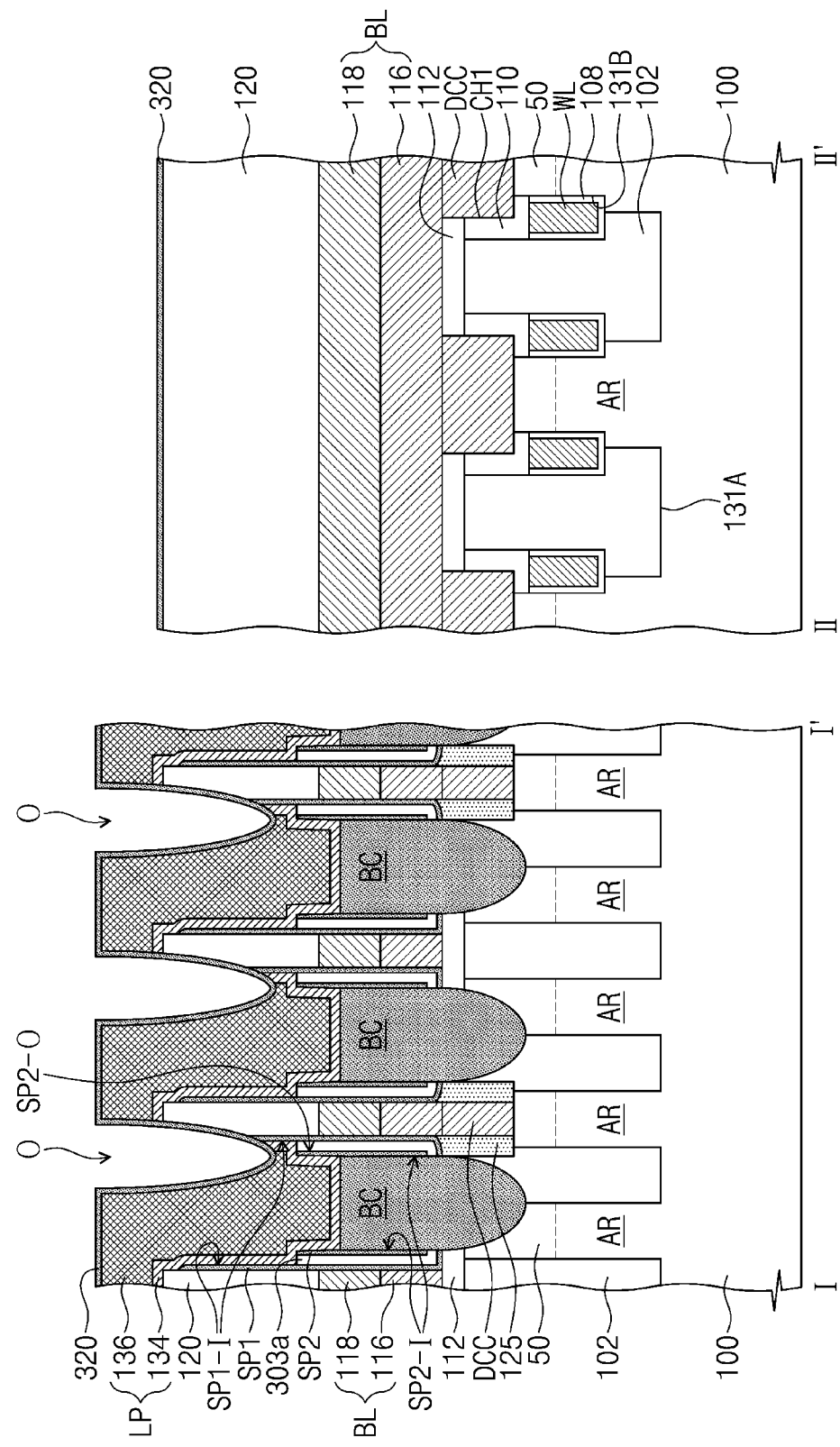

Referring to FIGS. 9A and 9B, landing pads LP may be formed on the storage node contacts BC. For example, the formation of the landing pads LP may include the followings: forming a barrier layer (not shown) to conformally cover top surfaces of the storage node contacts BC, top surfaces and upper inner sidewalls of the second spacers SP2, top surfaces of the sacrificial spacers 303a, upper inner sidewalls and top surfaces of the first spacers SP1, and top surfaces of the insulation patterns 120; forming on the barrier layer a metal layer (not shown) to fill the second channel holes CH2; and sequentially patterning the barrier layer and the metal layer to form the landing pads LP. The patterning process may form an internal space O between two landing pads LP. Each of the landing pads LP may include a barrier pattern 134 and a metal pattern 136 that are sequentially formed on each of the storage node contacts BC. For example, the internal space O may separate two adjacent landing pads LP along the first direction (X-axis).

A peripheral circuit layer 320 may be formed to conformally cover top surfaces and sidewalls of the landing pads LP and also cover portions of top surfaces of the insulation patterns 120 exposed through the landing pads LP. In a semiconductor memory device according to an exemplary embodiment of the present inventive concept, the peripheral circuit layer 320 may be formed on a peripheral circuit region provided with transistors by which the semiconductor memory device is operated. The peripheral circuit layer 320 may include, for example, silicon nitride.

Figure 10A:
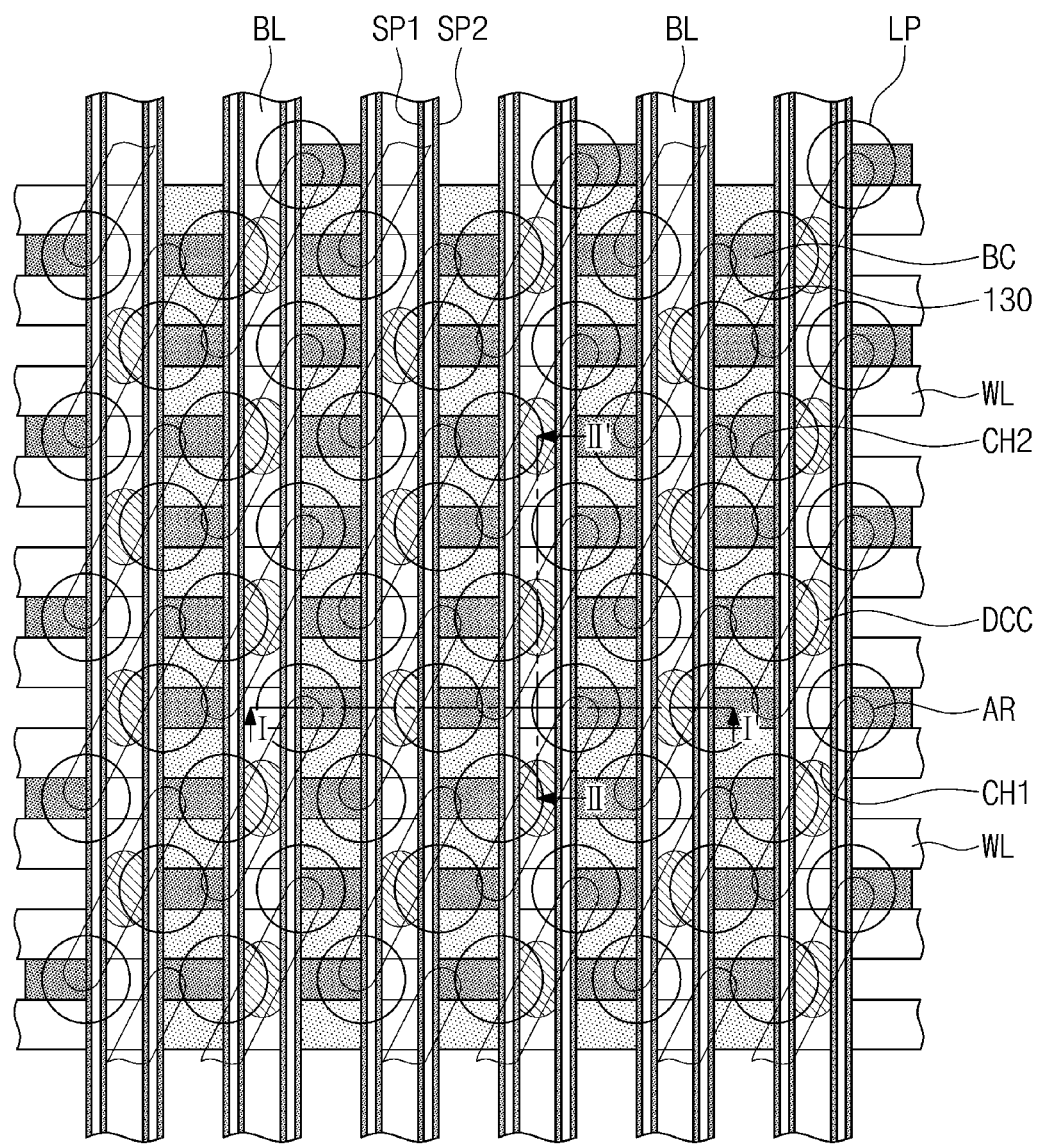
Figure 10B:
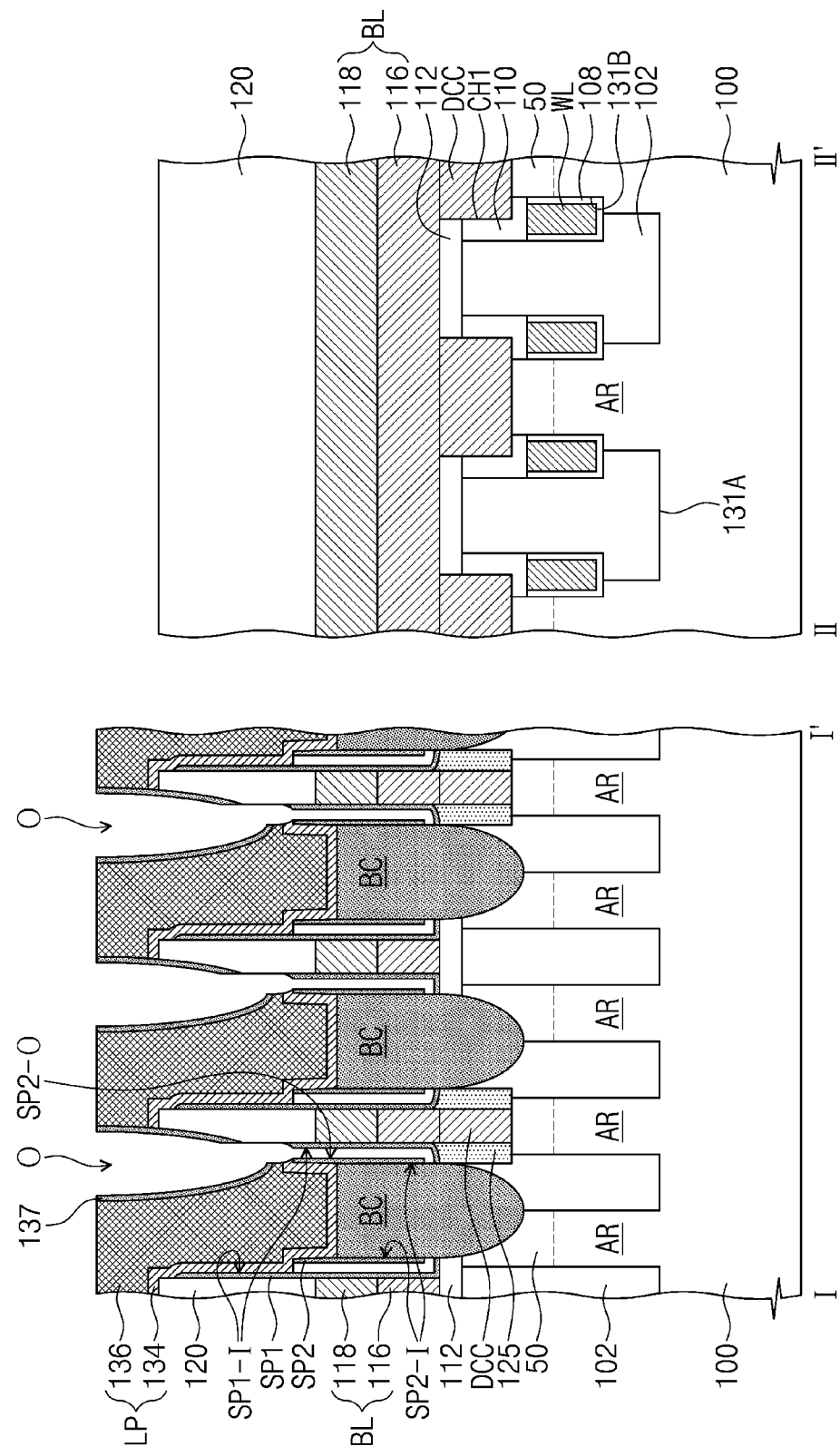

Referring to FIGS. 10A and 10B, an etch process may be performed to etch a bottom surface of the internal space O and expose top surfaces of the sacrificial spacers 303a. The etch process may be performed such that the peripheral circuit layer 320 is partially etched on its portion covering the top surfaces of the landing pads LP and the bottom surface of the internal space O, which may form residual patterns 137 covering sidewalls of the lading pads LP. The first and second spacers SP1 and SP2 may be exposed on their top surfaces when the top surfaces of the sacrificial spacers 303a are exposed. In addition, in the internal space O, the etch process may partially expose the sidewalls of the landing pads LP through the second spacers SP2 and the residual patterns 137. For example, in the internal space O, the sidewall of each of the landing pads LP may have a lower portion, which is adjacent to each of the first spacers SP1. For example, the lower portion of the sidewall of each of the landing pads LP may be composed of a portion of the barrier pattern 134 and a portion of the metal pattern 136. The etch process may include a dry etch process.

A selective removal may be performed on the sacrificial spacers 303a exposed to the internal space O. The internal space O may therefore extend between first and second spacers SP1 and SP2. Due to the removal of the sacrificial spacers 303a, inner sidewalls SP1-I of the first spacers SP1, outer sidewalls SP2-O of the second spacers SP2, and portions of the storage node contacts BC may be exposed to the internal space O. The sacrificial spacers 303a may be removed by using an etch recipe having etch selectivity with respect to the first and second spacers SP1 and SP2. The sacrificial spacers 303a may be removed by a wet etch process that uses an etchant such as, for example, hydrofluoric acid (HF) or a chemical solution containing HF and NH$_4$F ("LAL").

Figure 11A:
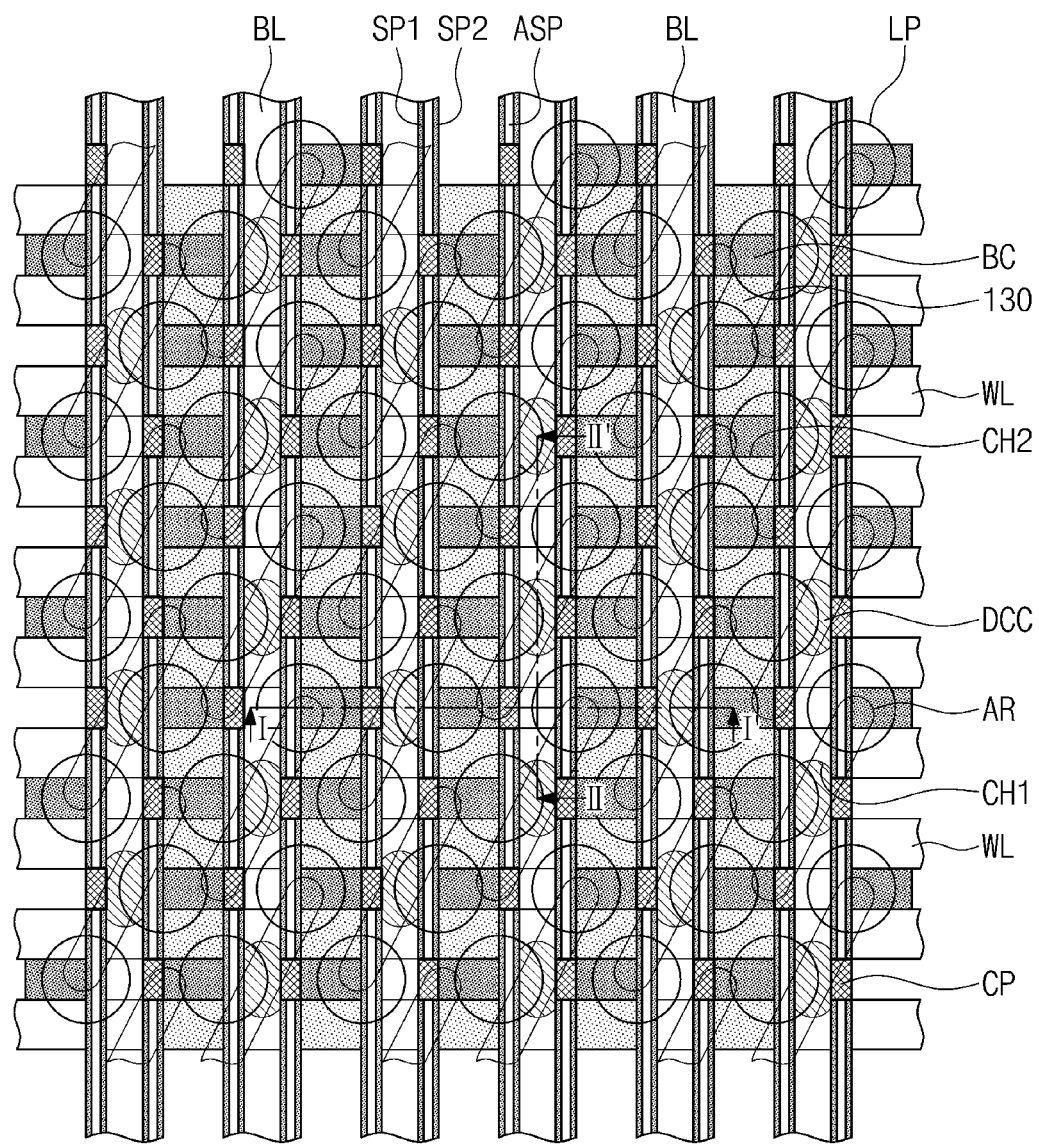
Figure 11B:
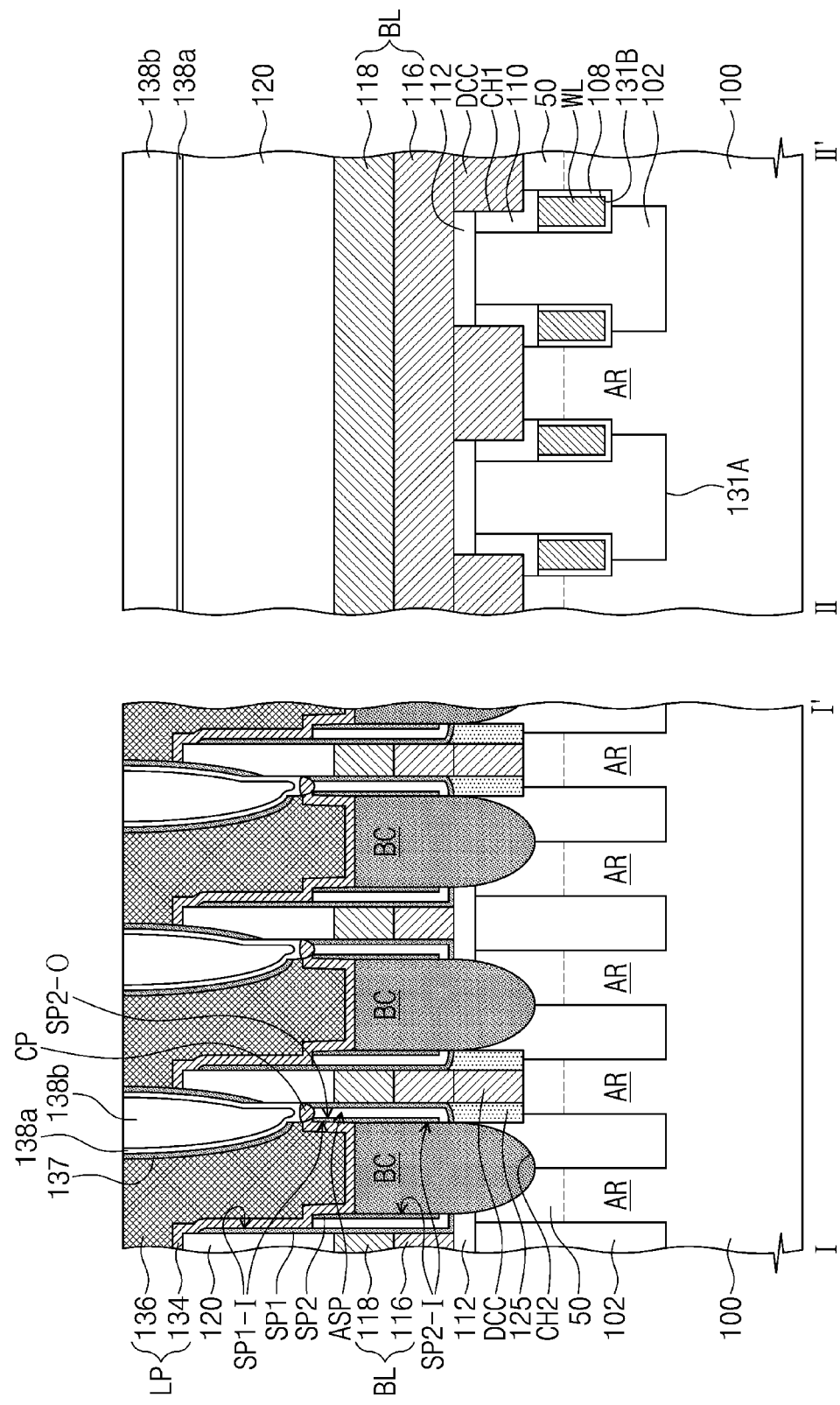

Referring to FIGS. 11A and 11B, capping patterns CP may be formed on portions of the sidewalls of the landing pads LP exposed from the second spacers SP2 and the residual patterns 137. The capping patterns CP may cover or close upper portions of spaces formed between the first and second spacers SP1 and SP2, and thus air spacers ASP may be defined between the first and second spacers SP1 and SP2. For example, the capping patterns CP may define top surfaces of the air spacers ASP. For example, the air spacers ASP each may be defined by the inner sidewall SP1-I of each of the first sidewalls SP1, the outer sidewall SP2-O of each of the second sidewalls SP2, a bottom surface of each of the capping patterns CP and a portion of each of the storage node contacts BC. In this case, the portion of each of the storage node contacts BC may be exposed between a lower end of each of the second spacer SP2 and a bottom portion of each of the first spacers SP1. In an exemplary embodiment, the bottom portion of each of the first spacers SP1 may be in contact with one of the buried patterns 125 or the buffer layer 112.

Each of the capping patterns CP may be selectively grown from the barrier pattern 134, or the metal pattern 136, or both that are exposed from each of the second spacers SP2 and each of the residual patterns 137. For example, the capping patterns CP may be formed by an area-selective deposition process. The capping patterns CP may be grown from one or more of the barrier pattern 134 and the metal pattern 136 until contacting a sidewall of the insulation pattern 120 to completely cover or enclose the upper portion of the spaces between the first and second spacers SP1 and SP2.

In an exemplary embodiment, the capping patterns CP may be grown from the barrier pattern 134, or the metal pattern 136, or both, to the extent that the capping patterns CP are not in contact with a sidewall of the insulation pattern 120. In this case, the capping patterns CP may cover or enclose incompletely the upper portion of the spaces between the first and second spacers SP1 and SP2.

In an exemplary embodiment, the capping patterns CP may be selectively grown from the barrier pattern 134 exposed from the second spacer SP2 and the residual pattern 137. In this case, the capping patterns CP may include the same material as the barrier pattern 134. For example, the capping patterns CP may include TiN. The selective growth of the capping patterns CP from the barrier patterns 134 may be achieved by repeating several times a cycle that includes the followings: supplying a first source gas (e.g., $NH_3$) adsorbed on the barrier pattern 134, but not on the metal pattern 136, the first and second spacers SP1 and SP2, and the insulation pattern 120; purging the first source gas not adsorbed on the barrier pattern 134; supplying a precursor (e.g., $TiCl_4$) including a depositing target material and chemically combining the precursor and the first source gas to form a mono-atomic metal nitride layer on the barrier pattern 134; and purging the precursor not reacted with the first source gas. The present inventive concept is not limited thereto. For example, the supply order of the first source gas and the precursor may be reversed. The present inventive concept is not limited thereto. For example, the first source gas and the precursor may be supplied at substantially the same time. For example, the TiN may be supplied by a mix of processes including a chemical vapor deposition (CVD) process, a PVD process, or metal-organic chemical vapor deposition (MOCVD) process using metal-organic precursors such as Tetrakis(dimethylamino)titanium (TDMAT).

Figure 11C:
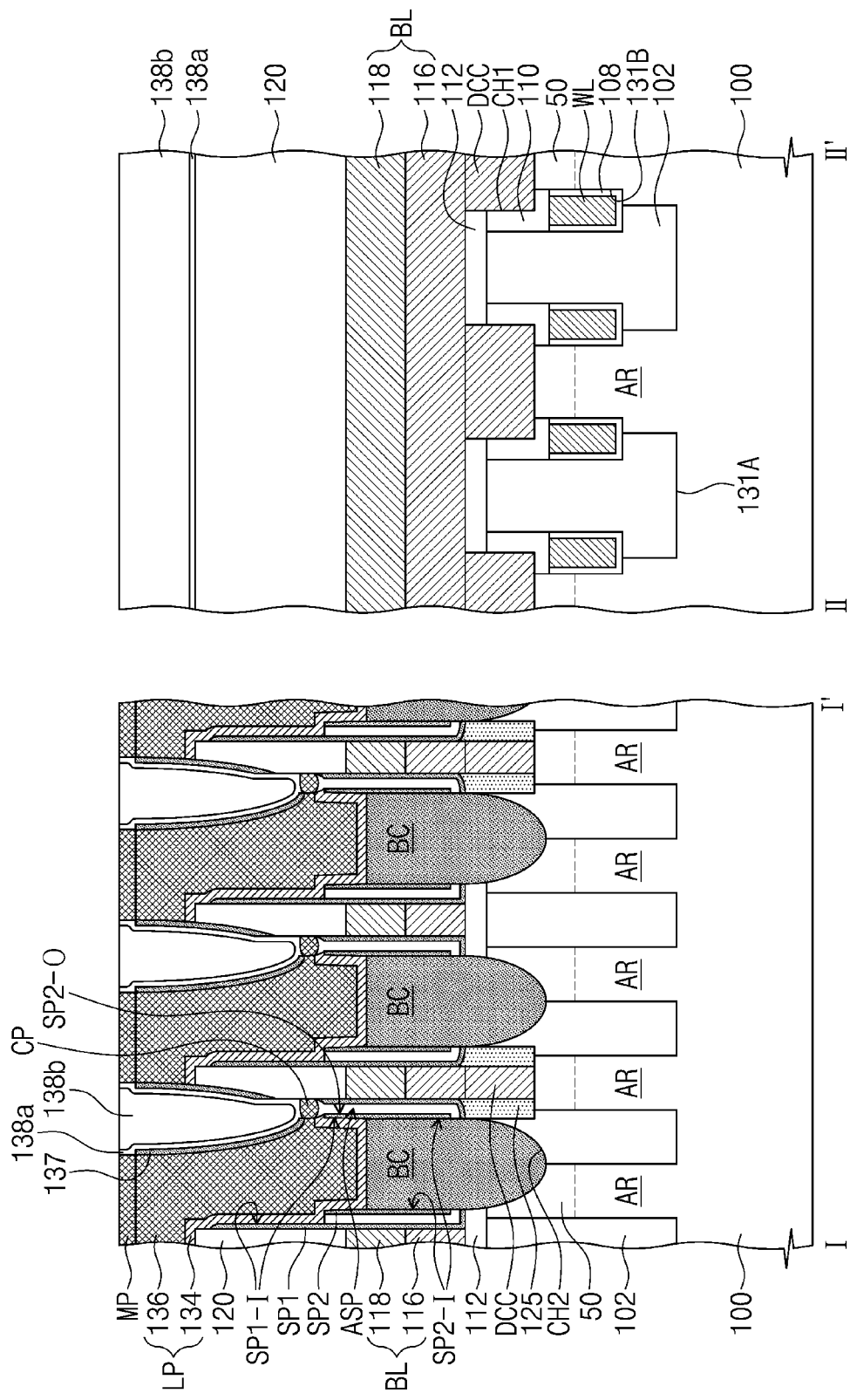

In an exemplary embodiment, as shown in FIG. 11C, the capping patterns CP may be selectively grown from the metal pattern 136 of each of the landing patterns LP exposed from the second spacer SP2 and the residual pattern 137. The capping patterns CP may include the same material as the metal pattern 136. For example, the capping patterns CP may include tungsten (W). The selective growth of the capping pattern CP from the metal pattern 136 may be achieved by repeating several times a chemical vapor deposition (CVD) cycle that includes the followings: supplying a first source gas (e.g., hydrogen ($H_2$), monosilane ($SiH_4$), or diborane ($B_2H_6$)) adsorbed on the metal pattern 136 but not on the barrier pattern 134, the first and second spacers SP1 and SP2, and the insulation pattern 120; purging the first source gas not adsorbed on the metal pattern 136; supplying a precursor (e.g., tungsten halide such as tungsten hexafluoride ($WF_6$) and tungsten hexachloride ($WCl_6$), or a metal-organic gas including tungsten element) including a depositing target material and chemically combining the precursor and the first source gas to form a mono-atomic metal layer on the metal pattern 136; and purging the precursor not reacted with the first source gas. The present inventive concept is not limited thereto. For example, the supply order of the first source gas and the precursor may be reversed. For example, the first source gas and the precursor may be supplied at substantially the same time.

During the formation of the capping patterns CP, upper metal patterns MP may be selectively grown from top surfaces of the metal patterns 136 exposed from the residual patterns 137. The upper metal pattern MP may include, for example, tungsten (W).

A first gap-fill layer 138a and a second gap-fill layer 138b may be sequentially formed in the internal space O. The first gap-fill layer 138a may conformally cover an inner surface of the inner spacer O. For example, the first gap-fill layer 138a may cover or enclose upper portions of the air spacers ASP incompletely covered with the capping patterns CP. The second gap-fill layer 138b may completely fill the inner space O. The first and second gap-fill layers 138a and 138b may include, for example, silicon nitride.

According to an exemplary embodiment of the present inventive concept, in the inner space O between the landing pads LP, the capping patterns CP each may be selectively grown from the barrier pattern 134, or the metal pattern 136, or both, each of which portions constitutes a portion of the sidewall of each of the landing pads LP exposed through the second spacer SP2, and may partially or completely cover the upper portion of the space between the first and second spacers SP1 and SP2, thereby defining the air spacer ASP between the first and second spacers SP1 and SP2. Therefore, in a process for forming the first gap-fill layer 138a in the inner space O, the capping patterns CP each may prevent the first gap-fill layer 138a from flowing into the space between the first and second spacers SP1 and SP2. In addition, the air spacer ASP may be prevented from reduction of its area. As a result, it may be possible to prevent or suppress increase of parasitic capacitance between the bit lines BL and the storage node contacts BC.

Referring back to FIGS. 1 and 2, data storage members DSM may be formed on the landing pads LP. The data storage members DSM may be, for example, a capacitor. The formation of the data storage members DSM may include forming on the landing pads LP bottom electrodes BE, a dielectric layer DL, and a top electrode TE.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. A semiconductor memory device comprising:
   a substrate;
   a device isolation layer disposed in the substrate defining an active region extending in a first direction;
   first conductive lines disposed in the active region and extending in a second direction crossing the first direction;

a second conductive line disposed on the active region between the first conductive lines and extending in a third direction crossing the first direction and the second direction;
an insulating pattern disposed on the second conductive line;
a bit line node contact disposed between the active region and the second conductive line;
a landing pad disposed on an edge portion of the active region;
a storage node contact between the landing pad and the edge portion of the active region;
a buried pattern disposed between the bit line node contact and the storage node contact;
a first spacer disposed between a sidewall of the second conductive line and the landing pad;
an air spacer disposed between the first spacer and the landing pad; and
a capping pattern protruding from a sidewall of the landing pad and disposed on the air spacer,
wherein the capping pattern is spaced apart from the first spacer, and
wherein the air spacer is in contact with a sidewall of the insulating pattern.

2. The semiconductor memory device of claim 1, wherein the capping pattern covers at least a portion of an upper portion of the air spacer.

3. The semiconductor memory device of claim 1, wherein the landing pad comprises a barrier pattern and a metal pattern stacked on the edge portion of the active region,
wherein the capping pattern includes the same material as the barrier pattern of the landing pad,
wherein the capping pattern includes a different material with a material of the metal pattern of the landing pad.

4. The semiconductor memory device of claim 1, wherein the landing pad comprises a barrier pattern and a metal pattern stacked disposed on the active region,
wherein the capping pattern includes a different material with a material of the barrier pattern of the landing pad,
wherein the capping pattern includes the same material as the metal pattern of the landing pad.

5. The semiconductor memory device of claim 1, further comprising a second spacer disposed between the landing pad and the air spacer below the capping pattern,
wherein the capping pattern is spaced apart from the second spacer.

6. The semiconductor memory device of claim 1, further comprising a second spacer disposed between the landing pad and the air spacer below the capping pattern,
wherein the second spacer is covered by a portion of the sidewall of the landing pad.

7. The semiconductor memory device of claim 1, further comprising a gap fill layer disposed on the capping pattern,
wherein the gap fill layer covers a portion of the sidewall of the landing pad above the capping pattern and a top surface of the capping pattern.

8. The semiconductor memory device of claim 7, wherein the gap fill layer covers at least a portion of an upper portion of the air spacer.

9. The semiconductor memory device of claim 8, wherein the gap fill layer is spaced apart from the first spacer.

10. The semiconductor memory device of claim 8, wherein the gap fill layer is spaced apart from the insulating pattern.

11. The semiconductor memory device of claim 7, wherein a level of a lowermost upper surface of the gap fill layer from an upper surface of the substrate is higher than a level of the top surface of the capping pattern from the upper surface of the substrate.

12. The semiconductor memory device of claim 1, further comprising a data storage member disposed on the landing pad.

13. The semiconductor memory device of claim 1, wherein the first spacer overlaps an upper portion of the air spacer in a vertical direction.

14. The semiconductor memory device of claim 1, wherein a level of a top end of the first spacer is higher than a level of a bottom surface of the insulating pattern.

15. A semiconductor memory device comprising:
a substrate;
a device isolation layer disposed in the substrate defining an active region extending in a first direction;
first conductive lines disposed in the active region and extending in a second direction crossing the first direction;
a second conductive line disposed on the active region between the first conductive lines and extending in a third direction crossing the first direction and the second direction;
an insulating pattern disposed on the second conductive line;
a bit line node contact disposed between the active region and the second conductive line;
a landing pad disposed on an edge portion of the active region;
a storage node contact between the landing pad and the edge portion of the active region;
a buried pattern disposed between the bit line node contact and the storage node contact;
an air spacer disposed between a sidewall of the second conductive line and the landing pad; and
a capping pattern protruding from a sidewall of the landing pad,
wherein the capping pattern partially covers an upper portion of the air spacer, and
wherein the air spacer is in contact with a sidewall of the insulating pattern.

16. The semiconductor memory device of claim 15, further comprising a gap fill layer on the capping pattern,
wherein the gap fill layer covers the upper portion of the air spacer exposed by the capping pattern, and is spaced apart from the insulating pattern.

17. The semiconductor memory device of claim 15, wherein the landing pad comprises a barrier pattern and a metal pattern stacked on the edge portion of the active region,
wherein the capping pattern includes the same material as the barrier pattern,
wherein the capping pattern includes a different material with a material of the metal pattern.

18. The semiconductor memory device of claim 15, wherein the landing pad comprises a barrier pattern and a metal pattern stacked on the edge portion of the active region,
wherein the capping pattern includes a different material with a material of the barrier pattern,
wherein the capping pattern includes the same material as the metal pattern.

19. A semiconductor memory device comprising:
a substrate;
a device isolation layer disposed in the substrate defining an active region extending in a first direction;

first conductive lines disposed in the active region and extending in a second direction crossing the first direction;

a second conductive line disposed on the active region between the first conductive lines and extending in a third direction crossing the first direction and the second direction;

an insulating pattern disposed on the second conductive line;

a bit line node contact disposed between the active region and the second conductive line;

a landing pad disposed on an edge portion of the active region;

a storage node contact between the landing pad and the edge portion of the active region;

a buried pattern disposed between the bit line node contact and the storage node contact;

an air spacer disposed between a sidewall of the second conductive line and the landing pad;

a capping pattern protruding from a sidewall of the landing pad; and a gap fill layer on the capping pattern, wherein the capping pattern covers a first upper portion of the air spacer, wherein the gap fill layer covers a second upper portion of the air spacer, and wherein the second upper portion of the air spacer is in contact with a sidewall of the insulating pattern.

20. The semiconductor memory device of claim 19, wherein the capping pattern includes the same material as the material of the landing pad, wherein the gap fill layer includes an insulating material.

* * * * *